United States Patent [19]
Ohmoto et al.

[11] Patent Number: 5,646,617
[45] Date of Patent: Jul. 8, 1997

[54] DATA COMPRESSING METHOD, DATA RESTORING METHOD, AND INFORMATION PROCESSING APPARATUS

[75] Inventors: Ryuji Ohmoto; Hikonosuke Uwai, both of Nagano, Japan

[73] Assignee: Seiko Epson Corporation, Tokyo, Japan

[21] Appl. No.: 362,019

[22] Filed: Dec. 22, 1994

[30] Foreign Application Priority Data

Jun. 16, 1994 [JP] Japan .................................... 6-158099

[51] Int. Cl.$^6$ ..................................... H03M 7/30
[52] U.S. Cl. .............................. 341/51; 341/106
[58] Field of Search ................... 341/51, 95, 106

[56] References Cited

U.S. PATENT DOCUMENTS

| | | | |
|---|---|---|---|
| 4,843,389 | 6/1989 | Lisle et al. | 341/106 |
| 5,087,913 | 2/1992 | Eastman | 341/95 |
| 5,243,341 | 9/1993 | Seroussi et al. | 341/51 |
| 5,323,155 | 6/1994 | Iyer et al. | 341/51 |
| 5,412,384 | 5/1995 | Chang et al. | 341/79 |
| 5,488,365 | 1/1996 | Seroussi et al. | 341/51 |

FOREIGN PATENT DOCUMENTS 0595064  5/1994  European Pat. Off. .

OTHER PUBLICATIONS

Storer, James A., "Data Compression: Methods and Theory", Computer Science Press, 1988, pp. 69–73 Jan. 1988.

*Primary Examiner*—Marc S. Hoff
*Attorney, Agent, or Firm*—Sughrue, Mion, Zinn, Macpeak & Seas

[57] ABSTRACT

The present invention offers a system which operates with reference to a dictionary for registering a registered data string as correlated to a registration number and for performing a data compressing process by replacing a combination consisting of two or more character strings with a registration number mentioned above. The system according to the present invention performs the compilation and updating of the dictionary at the Step A1 and A2, respectively, and judges at the Step A3 whether or not the dictionary has become the optimum dictionary. The system performs the updating of the dictionary in such a case by an incremental decomposition method, or an augmentative decomposition method, or the like. Then, as shown for the Steps A4 and A5, the system compiles the optimum dictionary, at which stage the system puts out the dictionary as the ultimate static dictionary for its use for data restoration and also performs a data compressing process with reference to the above-mentioned static dictionary, putting out the compressed data as the ultimate compressed data to be used for data restoration.

11 Claims, 20 Drawing Sheets

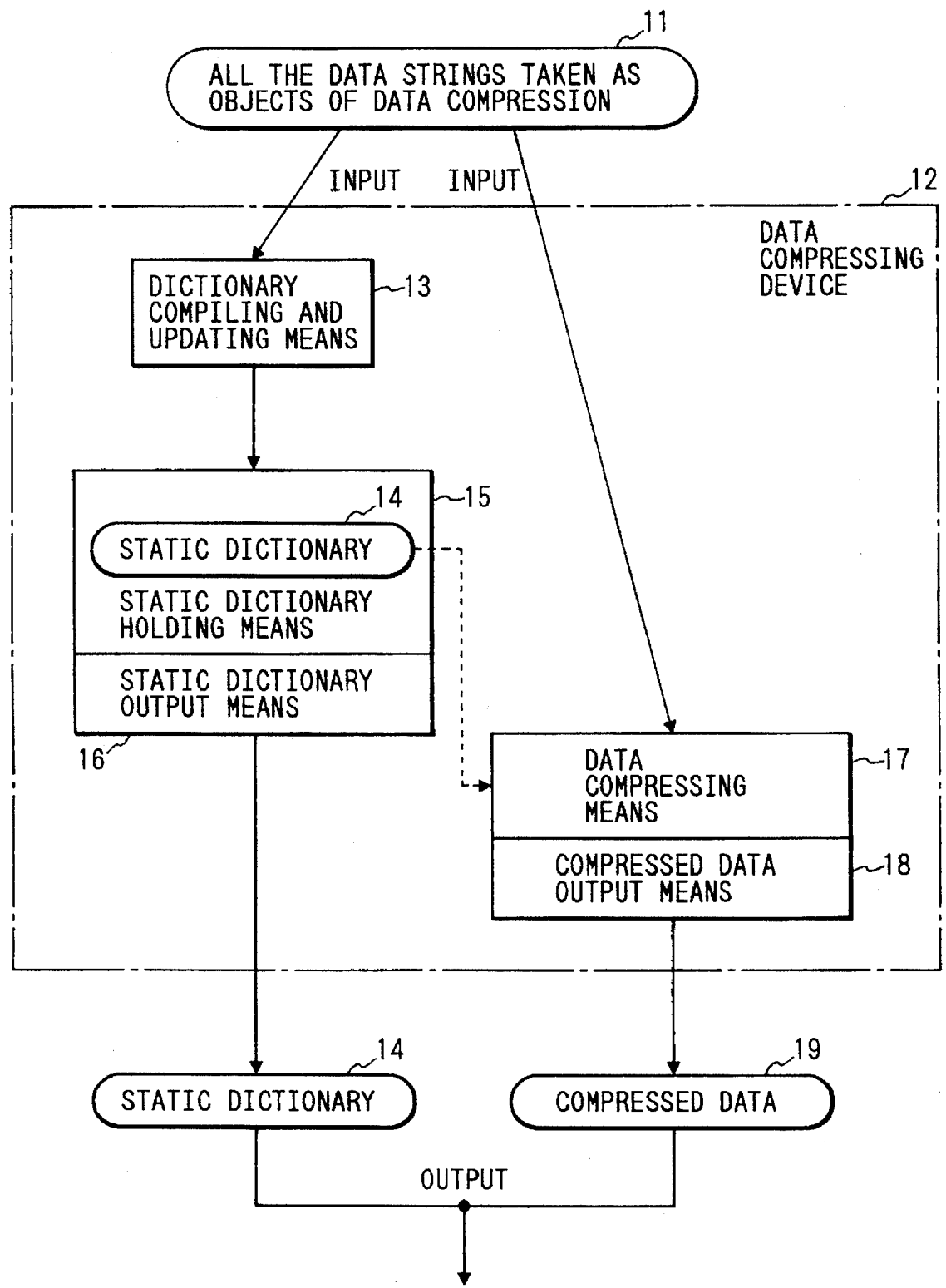

FOR PERFORMANCE OF PROCESSING OPERATIONS IN ACCORDANCE WITH AUGMENTATIVE DECOMPOSITION METHOD

FOR PERFORMANCE OF PROCESSING OPERATIONS IN ACCORDANCE WITH INCREMENTAL DECOMPOSITION METHOD

FOR PERFORMANCE OF PROCESSING OPERATIONS IN ACCORDANCE WITH AUGMENTATIVE DECOMPOSITION METHOD

FOR PERFORMANCE OF PROCESSING OPERATIONS IN ACCORDANCE WITH INCREMENTAL DECOMPOSITION METHOD

MOVES FROM NUMBER INDICATED IN UPPER POSITION TO NUMBER INDICATED IN LOWER POSITION

|     | THE FIRST CHARACTER POSITION | THE SECOND CHARACTER POSITION | FREQUENCY IN USAGE |
|-----|------|------|---|
| 256 | 30   | 56   | 1 |
| 257 | 80   | 16   | 1 |
| 258 |      |      |   |
| 259 | 42   | 35   | 4 |
| 260 | 43   | 39   | 3 |
| ⋮   | ⋮    | ⋮    | ⋮ |
| 4095| 90   | 80   | 2 |

P → 258

| | CHARACTER STRING (TWO BYTES) | CHARACTER STRING STARTING ADDRESS (TWO BYTES) |
|---|---|---|
| 256 | | |
| 257 | ⋮ | ⋮ |
| 4095 | | |
| | CORE PORTION OF CHARACTER STRINGS (ARRANGEMENT OF CHARACTER STRINGS, APPROXIMATELY 16K) | |

```
256 : 5 BYTES, 0000H
257 : 3 BYTES, 0005H
258 : 6 BYTES, 0008H
  ⋮
4095 : 8 BYTES, 80AEH
```

ABABCDEFGABBABDEFD     EFABBABB

FIG. 16(A)

| | 8 DOTS → | | | | |
|---|---|---|---|---|---|
| | 0 | 40 | 80 | 120 | 160 |
| | 1 | 41 | 81 | 121 | 161 |
| | 2 | | | | |
| | ⋮ | | | | |
| | 39 | | | | |

DATA BLOCK

FIG. 16(B)

| | 16 DOTS → | | |
|---|---|---|---|
| | 0 | 40 | 80 |
| | 1 | 41 | 81 |
| | 2 | | |
| | ⋮ | | |
| | 39 | | |

DATA COMPRESSING METHOD, DATA RESTORING METHOD, AND INFORMATION PROCESSING APPARATUS

BACKGROUND OF THE INVENTION

The present invention relates to a data compressing method to be performed with reference to a dictionary which registers a registered data string as correlated with a registration number, to a data restoring method for restoring the compressed data, and an information processing apparatus for compressing the data strings and for restoring the compressed data strings.

Such information processing apparatuses as printers have recently been facing a demand for their increased added value achieved through their supply of bit map fonts and outline fonts in various print character sizes and for high quality to be maintained for any and all print character sizes. In view of these circumstances, data compressing technology, which provides a way of efficient storage of a large amount of information containing these font data, has recently begun to attract much attention in the field of printers and the like.

The publicly known conventional techniques for data compression for storing or transmitting a large amount of information in as small a capacity as possible include the technique for converting data in fixed length bits into a code in a variable length bits, such as the Huffman Code, and a technique for performing a data compression by utilization of an agreement between the data strings which appeared in the past and the data strings to be compressed hereafter, such as the techniques in a patent generally called "the Lempel-Ziv patent" (as disclosed in the Specification for the U.S. Pat. No. 4,464,650) and the techniques in the LZW patent (as disclosed in the Specification for the U.S. Pat. No. 4,558,302).

However, these conventional techniques are data compressing methods performed by using the so-called dynamic dictionary. That is to say, these techniques represent a method for performing an analysis of the object data to be compressed, registering the data in the form of a dictionary structure while checking the frequency of occurrence and the like, and concurrently keep compressing the data with reference to this dictionary. In this case, it is a feature characteristic of such a method that the dictionary undergoes steady changes on a real-time basis. In a data compression with such a dynamic dictionary, there remain as generated products only those data taken as objects and subjected to their data compression, but a restoration of such compressed data requires an examination of the history data as of the time of their data compression and a restoration of the next data through a re-compilation of the dictionary. Therefore, such a conventional technique presents the disadvantage that the data restoring operation must be performed in a serial order starting with the beginning of the compressed data taken up as the objects of the data restoration.

Now, the compression of font data in a printer or the like is performed in such a manner that the compressed font data are stored in a memory device provided either at the printer side or at the host computer side. Then, at the time of a printing operation, the system takes out the compressed font data as necessary from the memory device and forms the print character data by restoring the compressed font data to the ordinary data. Therefore, in case any data compression is to be employed under conditions like these, the requisite is how promptly the system restores the compressed data stored in the memory device and generate the print character data.

Also, another point which becomes important at a time when font data are to be compressed in a printer or the like is to provide the kind of operating freedom that ensures the possibility of putting out the print character data (i.e., letters) in any sequential order. In other words, it is to be required of a printer to make random access to the data stored in a memory device in it and to form print character data at random.

It is considered that such data compressing methods as those disclosed in the Lempel-Ziv patent specification and in the LZW patent specification, which are considered to be capable of attaining a higher ratio of data compression than by any such data compression method as that of the Huffman Code, will form a main current of the data compressing technology to be established from this time onward. In the meanwhile, however, these data compressing techniques operate in a data compressing process to be performed with reference to a dynamic dictionary, and, for this reason, the data restoring process by any of these methods requires an examination of the past data characteristics and the updating of the data, and, consequently, these data compressing methods present the disadvantage that each of them takes time in the restoration of the compressed data.

Further, the data compressing methods disclosed in the Lempel-Ziv patent and the LZW patent require that the compressed data should be restored in a serial order from the beginning of the data when the compressed data are to be restored, and these methods thus present the disadvantage that these methods does not allow the operator to take out only the necessary print character data when only such data are needed.

Furthermore, the data compressing method which is called an incremental decomposition method, which is used in the LZW method, etc., cannot increase the number of data strings one by one, so that the data compressing method presents the disadvantage that it is not capable of attaining any moderate further increase of the data compression ratio, for example, in case the same data strings appear in succession.

SUMMARY OF THE INVENTION

The present invention has been completed with a view to overcoming such disadvantages as those described hereinabove, and it is thus an object of the present invention to offer: a data compressing method which is capable of attaining such a high compression ratio as that achieved by the Lempel-Ziv data compressing method or the LZW and yet is capable of finishing the data restoring process in a relatively short period of time and additionally enables the operator freely to restore only the necessary data out of the compressed data; a data restoring method which is capable of restoring the compressed data strings in an efficient manner; and an information processing apparatus which enables the operator to perform data compression and data restoration efficiently by the data compressing method and by the compressed data restoring method as disclosed herein.

Further, another object of the present invention is to offer: a data compressing method which is capable of reducing the memory capacity required for the storage of the compressed data strings and the dictionary generated in the course of their compression, achieving such a reduction of the memory capacity by creating a method attaining a higher compression ratio than that achieved by the incremental decomposition method; a compressed data restoring method which is capable of restoring the compressed data; and an information processing apparatus which is capable of performing the data compressing method and the compressed data restoring method.

BRIEF DESCRIPTION OF THE DRAWINGS

FIG. 2 is a block diagram for illustrating an example of the construction of a data compressing device which is used for the performance of the data compressing method described in the first embodiment of the present invention;

FIGS. 16(A) and 16(B) are schematic charts respectively illustrating the process for the compression of bit map data;

DETAILED DESCRIPTION OF THE PREFERRED EMBODIMENTS

Now, preferred embodiments of the present invention will be described with reference to the accompanying drawings. In this regard, a description will be given with respect to a first embodiment and a second embodiment, with an example taken, for simplifying the description, from a case in which the data strings compressed are mainly character strings. However, it should be noted that the data strings which can be processed by the data compressing and data restoring method according to the present invention include not only character strings like those described in these embodiments, but also all the types of data strings, such as byte strings and word strings, which, for example, form font data.

1. First Embodiment

Figure 1:
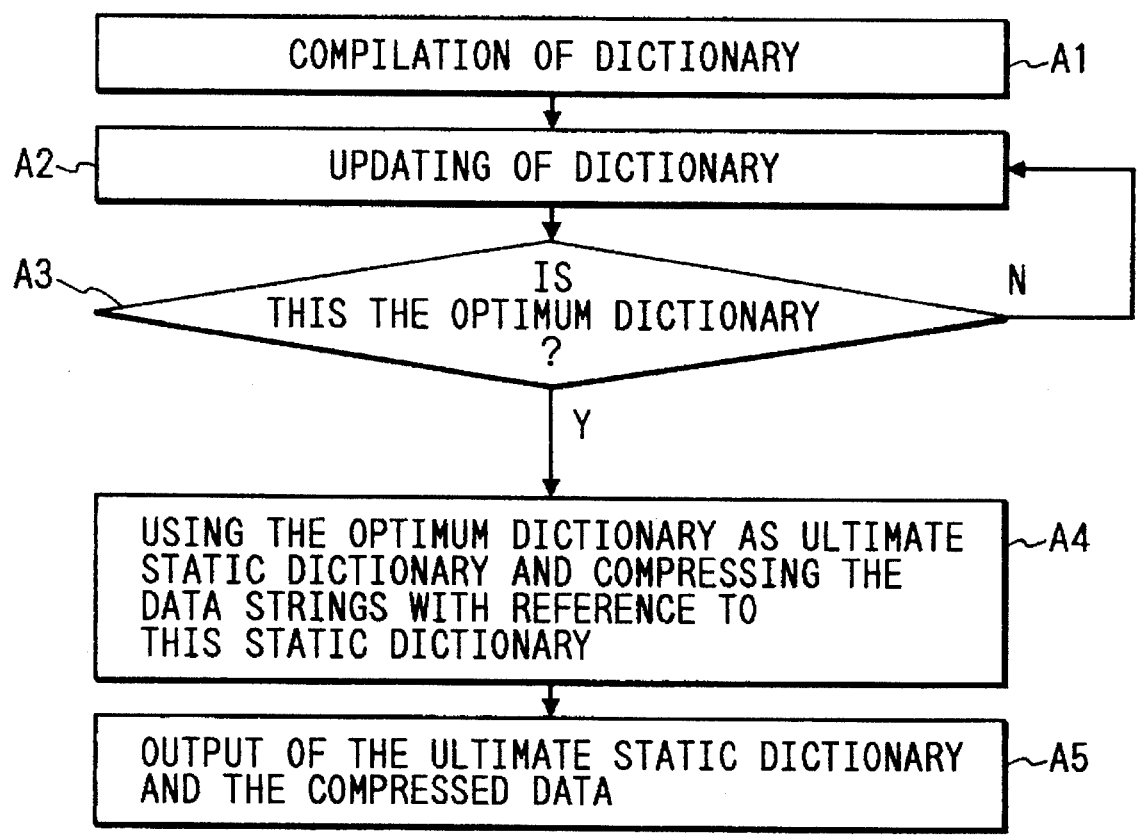
FIG. 1 presents a flow chart for illustrating the data compressing method which is described in a first embodiment of the present invention.

FIG. 1 presents a flow chart for illustrating a data compressing method described in this example of preferred embodiment of the present invention. The data compressing method described in this example of embodiment uses a dictionary which is capable of registering the registered data strings by correlating them with registration numbers. Then, a data compression is to be performed by replacing two or more combinations of data strings with such a registration number. First, a dictionary is generated (at the Step A1) from all the data strings (for example, character strings) which are taken as the objects of data compression, and the updating of the dictionary will be repeated (at the Step A2, A3) until an optimum dictionary for the data compression is generated. Thereafter, at the stage where the optimum dictionary has been compiled, the dictionary is used as the ultimate static dictionary for the data restoration, and the data compression of the data strings which are taken as the objects of the data compression will be performed with reference to this static dictionary (at the Step A4). Then, by this process, the ultimate compressed data for data restoration and the ultimate static dictionary for use for the data restoration will be generated and stored in a memory device or a memory medium such as a mask ROM and an EEPROM. Then, a data restoring process will be performed in an information processing apparatus, such as a printer or a host computer, with reference to the static dictionary and by using the compressed data thus stored in a memory device or the like.

In this regard, there are various conceivable techniques, which will be described herein later, which can be used as a technique for determining at which stage a dictionary which is kept generated and updated in repetition has been formed into the optimum dictionary for the data compression.

FIG. 2 illustrates an example of the construction of the data compressing device 12 to which a data compressing method described in this example of preferred embodiment of the present invention is applied. All the data strings 11 which are taken up as the objects of the data compression are first fed into a dictionary compiling and updating means 13, and a dictionary is thereby compiled and updated with the data strings thus supplied. Then, at the stage when a dictionary optimum for the data compressing process has been compiled, the particular dictionary is held as a static dictionary 14 in a static dictionary holding means 15. Thereafter, the optimum static dictionary 14 thus held in the static dictionary holding means 14 is put out by a static dictionary output means 16 to an external memory means (which is not illustrated in FIG. 2) and also is utilized for compressing all the data strings 11 by a data compressing means 17. This data compressing process is performed by replacing two or more combinations of data strings with a registration number held in the dictionary. Further, the compressed data 19 obtained as the result of this data compressing operation are put out to an external memory device by a compressed data output means 18.

Next, a description will be made of the construction of the dictionary in this example of preferred embodiment. For example, let us consider a case in which the data string (i.e., the character string), "static_string_dictionary," is to be compressed. Let us assume then that a combination of eight data strings are registered in this case as shown below: "st", "at", "ic", "_", "st", "ring_d", "ic", "tionary". In this case, the combinations of these data strings are registered as correlated to the registration numbers as shown in the following part:

0: st
1: at
2: ic
3: _
4: ring_d
5: tionary

Then, the data string, "static_string_dictionary," can be replaced by these registration numbers as: 0, 1, 2, 3, 0, 4, 2, 5, and the data can be compressed by such a replacement.

Next, a description will be given with respect to various techniques for compiling the optimum dictionary. In this example of preferred embodiment, two items, one being a static dictionary and the other being the compressed data, are put out ultimately, and these items are stored in a memory device. Therefore, in order to save the used capacity of the memory device, it is necessary to reduce the amount of the data which are registered in the ultimate static dictionary and also the amount of the compressed data, and a dictionary which is capable of achieving appropriate reductions of these amounts of data can be considered to be the optimum dictionary. That is to say, it is desirable for the compilation of the optimum dictionary that the amount of data in the dictionary itself can be reduced, and it is desirable that the amount of the compressed data can be reduced. In order to accomplish this, the following first through fourth techniques, for example, are utilized in this example of embodiment. Moreover, the present invention will be described below with reference to examples in which character strings are used as data strings.

(A) First Method for Producing the Optimum Dictionary

This method utilizes a method which is called "a sliding dictionary" which compiles a dictionary by registering those combinations of data strings with priority given in the registration to those combinations of data strings which are composed of a large number of data strings in a combination. Then, this method produces the optimum dictionary by making deletions of the registered entries in the compiled dictionary in serial order on the basis of information on the frequency of usage.

Further, the method called "a sliding dictionary" will be described below with reference to FIGS. 3(A) to 3(E). This method stores all the character strings 41, which are to be taken up as the objects of the data compressing process, as the object character strings 43, in a serial order starting with the first character string in a memory space forming a work area. Then, it is examined whether or not any character string identical to the object character string 43 just mentioned is present in the past character string 42 (i.e., from the beginning to the character string before the object character string 43). Then, if it is found that there is no identical character string in the past character string 42, the first single character in the object character string 43 is shifted (i.e., slid) from the object character string 43 to the past character string 42. On the other hand, if it is found that the same character string is present in the past character string, then it is to be examined whether or not the next character string is in agreement, and, by repeating this procedure, the system finds out the longest character string in agreement (i.e. a character string which is composed of the largest number of combinations of character strings) between the past character string 42 and the object character string 43.

For example, let us consider a case in which the character string to be taken up as the object of the data compression is composed of the characters A, B, C, A, B, C, D, E, and F in the stated sequence. In this case, the character A will be first taken up as the object character string 43, but, since there is no identical character in the past character string, the character A is shifted to the sliding dictionary, which is composed of the past character string 42 (Refer to FIG. 3(B)). Then, the characters B and C, neither of which has any equivalent characters in the past character string, are therefore shifted to the sliding dictionary (Refer to FIG. 3(C)). Subsequently, the character A becomes a object character string 43, and yet the character A is found to be present in the sliding dictionary, and it is therefore examined whether or not the next character B is found to be in its agreement with the past character string (Refer to FIG. 3(D)). Now, it is found that the character B is in its agreement in this case, and it is therefore examined next whether or not the character C is in its agreement (Refer to FIG. 3(E)). Then, it is examined further whether or not the character D is in its agreement, and yet the character D is not found to be present in the sliding dictionary, so that it is determined in this case that the character string composed of A, B, and C is the longest character string in agreement.

Now, the method which is called the "sliding dictionary" compresses the character string composed, for example, of the characters A, B, C, A, B, C, D, E, and F into [A], [B], [C], [three characters respectively identical to the three preceding characters], [D], [E], and [F]. In specific terms, a character string is to be subjected to a data compression by expressing a character string by [no agreement flag=1 and a character code for the character] in the event that there is no agreement, but the longest character string in agreement is to be expressed by "an agreement flag=0 and the position of the agreement and the length in agreement, in the event that there is any agreement in the character strings.

In this example of preferred embodiment, however, the method for the sliding dictionary is not used for any actual compression of data, but is utilized only for the purpose of finding out the longest character string in agreement among the character strings to be taken up as the objects of the data compression. Then, when the longest character string in agreement has been found in this example of embodiment, the system registers this longest character in agreement in the dictionary as correlated with a registration number. In the example described above, the character string composed of the characters A, B, and C is to be registered in the dictionary. In this manner, the longest character string in agreement appearing two or more times is found out of all the character strings taken as the objects of the data compression, and these will be registered in the dictionary. By this operating procedure, those character strings which are found to have occurred in a larger number of combinations will be registered in the dictionary on a priority basis.

Figure 3A:
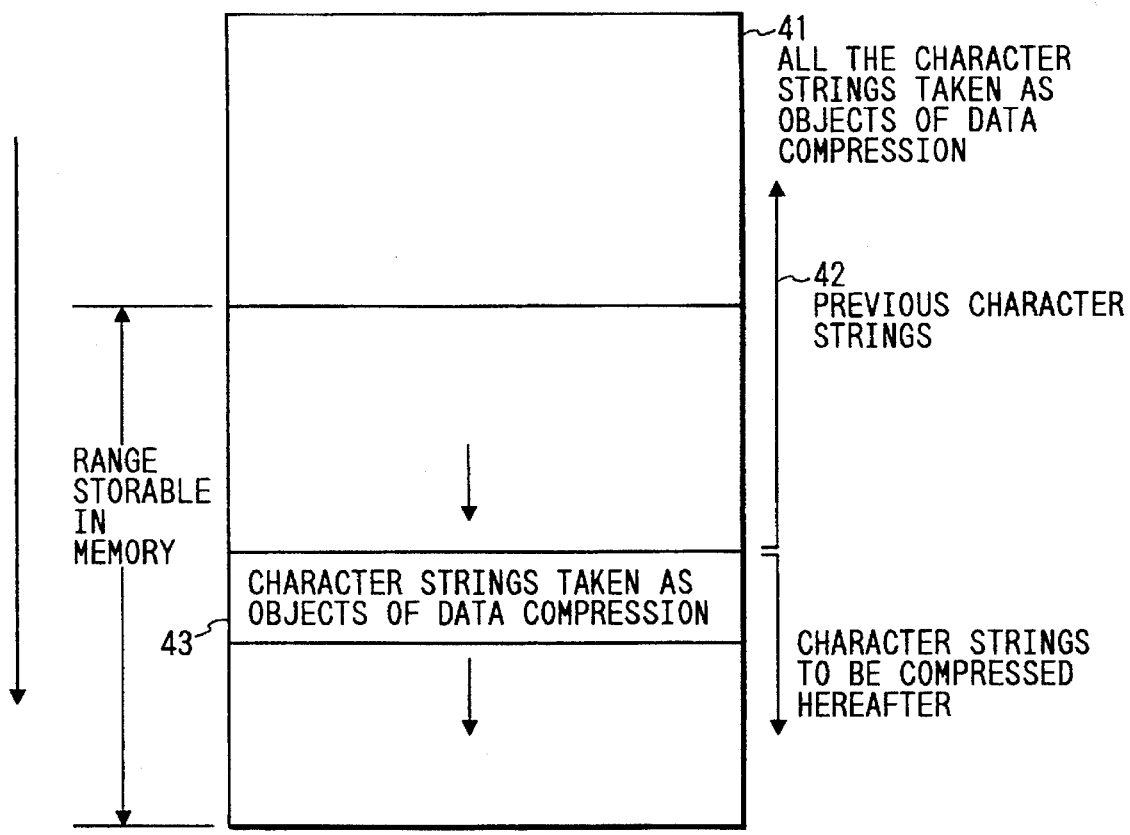
FIG. 3(A) through FIG. 3(E) are schematic drawings for furnishing a typical illustration of the method for a sliding dictionary.
Figure 3B:
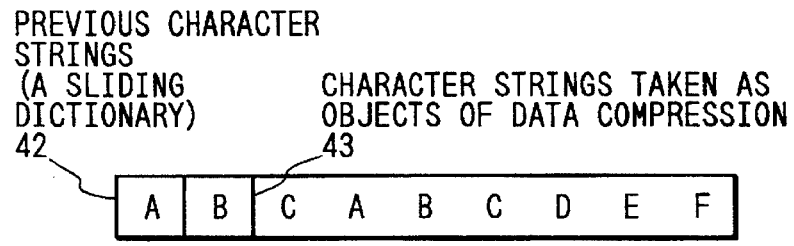
Figure 3C:
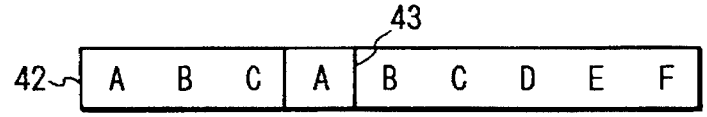
Figure 3D:
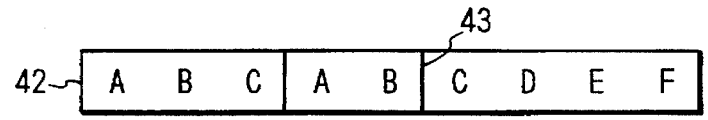
Figure 3E:
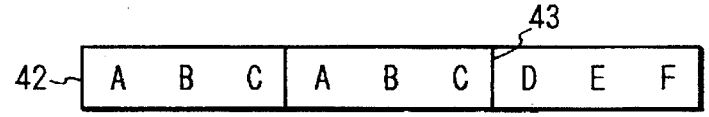

Moreover, in case a sliding dictionary is to be used, it is necessary to store the past character strings in a memory. However, as shown in FIG. 3(A), the capacity of the memory is finite, and the range of data that can be stored in the memory has a limit, so that only those character strings within the range storable in the memory out of the past character strings 42 are formed into the sliding dictionary.

Figure 4:
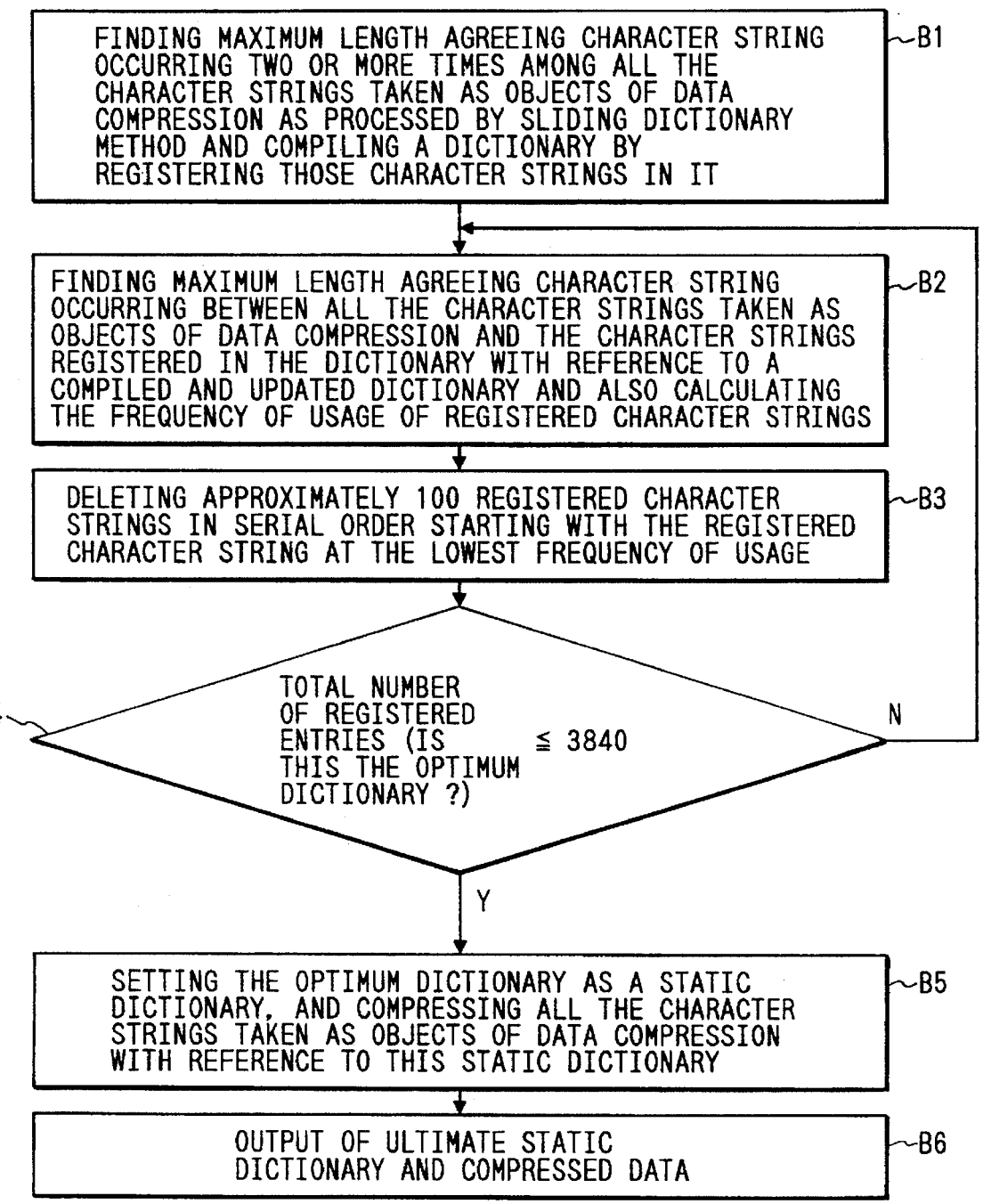
FIG. 4 is a flow chart for illustrating a method for compiling the optimum dictionary through utilization of the sliding dictionary method.

FIG. 4 presents a flow chart for illustrating a method for producing the optimum dictionary through utilization of a slide dictionary method. As shown in FIG. 4, those longest character strings in agreement which have occurred two or more times are first found out of the character strings taken up as the objects of the data compression by employing the sliding dictionary method, and these longest character strings in agreement are registered in the dictionary, and a dictionary is thereby compiled (the Step B1). Next, with reference to the dictionary thus compiled, those combinations of the character strings which are in agreement in the longest length with the character strings registered in the dictionary are to be found out of all the character strings taken as the objects of the data compression, and the frequency of usage of the registered character string is incremented by one at the point in time when the longest character strings in agreement are found (the Step B2). For example, in a case in which the character strings taken as the objects of the data compression are A, B, C, D, E, and F and the registered character strings are AB and ABC, the frequency of usage of the registered character string ABC is incremented by one.

After having calculated the frequency of usage in the manner described above, the system deletes the registration, for example, of approximately one hundred entries of those registered character strings at a low frequency of usage, starting the deleting operation with the registered character string at the lowest frequency of usage (the Step B3). In this case, let us assume that the total number of character strings which can be registered in the dictionary is 3,840 entries (e.g., 4,096−256=3,840), the system will perform the deletion of the registered character strings in such a manner that the total number of the registered entries remaining after the deleting operation will not be less than 3,840 entries. In specific terms, the system will delete only 60 entries of the registered character strings, for example, in a case where the total number of the character strings which are registered in the dictionary before the particular deleting operation is 3,900 entries.

Next, the system determines whether or not the total number of the registered character strings is 3,840 entries (i.e., the predetermined number of such entries) or less, and, in the event that it is found that the total number of the registered character strings in the dictionary is in any excess of 3,840 entries, the system returns to the Step B2 and calculates the frequency of usage again, then deleting the registration of the registered character strings in a total number, for example, up to approximately 100 entries at the Step B3. The system will repeat the Steps B2 to B4, thereby successively reducing the number of the character strings registered in the dictionary, and, at the point in time when the total number of the registered character strings has been reduced to 3,840 entries, the system will move onto the Step B5. Now that a dictionary can contain 3,840 entries, for example, as registered in it, it will be considered that the dictionary has become an optimum dictionary as at the time when it has come to contain a total of 3,840 entries in it.

Finally, the system uses such an optimum dictionary as a static dictionary, compressing all the character strings to be taken as the objects of the data compression with reference to such a static dictionary and putting out the ultimate static dictionary and the compressed data (at the Steps B5 and B6).

(B) Second Method for Producing the Optimum Dictionary

This method consists in compiling a dictionary by performing the registration of character strings with priority given to those which have a high probability of occurrence. Then, the system operating by this method compiles the optimum dictionary by successively deleting the character strings registered in the dictionary on the basis of the information on the frequency of their usage.

First, the system operating by this system calculates the probability of occurrence of the individual character strings for example by once performing an analysis of all the character strings to be taken up as the objects of the data compression. Then, on the basis of the probability of occurrence thus calculated, the system finds the probability of occurrence of each combination of the character strings.

For example, let us assume here that the analysis and calculation mentioned above have led to the finding that the probability of occurrence of the character strings are as stated in the following part:

a: 50%, b: 20%, c: 10%, and d: 5%.

Then, the probability of occurrence of the combination of the character strings aa and the like are calculated to be as stated below:

aa: 25%, aaa: 12.5%, ab: 10%, ba: 10%, ac: 5%, ca: 5%, aab: 5%, aba: 5%, baa: 5%, ad: 2.5% . . .

However, these are estimated values which are found on the assumption that there is no correlation in the probability of occurrence among the character strings.

After having obtained the probability of occurrence of combinations of character strings by the procedure described above, the system compiles a dictionary by registering those combinations of character strings with priority given to those having a higher probability of occurrence. Next, by applying a method similar to what is applied, for example, to the Steps B2 to B4 shown in FIG. 4, the system deletes the registered character strings at a lower frequency of usage until the total number of the registered character strings in the dictionary is reduced to the predetermined number of entries, for example, 3,840 entries, thereby compiling the optimum dictionary. Then, by a method similar to what is applied to the Steps B5 and B6, the system puts out the ultimate static dictionary and the compressed data which have been produced by compressing the data with reference to the ultimate static dictionary. With the method thus applied in the manner described above, the data compressing method offers the advantage that the initial analysis can be finished in a single scanning operation.

(C) Third Method for Producing the Optimum Dictionary

This method compiles the optimum dictionary by utilizing the incremental decomposition algorithm. As regards the details of the incremental decomposition algorithm, a description is given in a comparison of this algorithm with the augmentative decomposition algorithm as applied to a second example of preferred embodiment of the present invention as described later.

Figure 5:
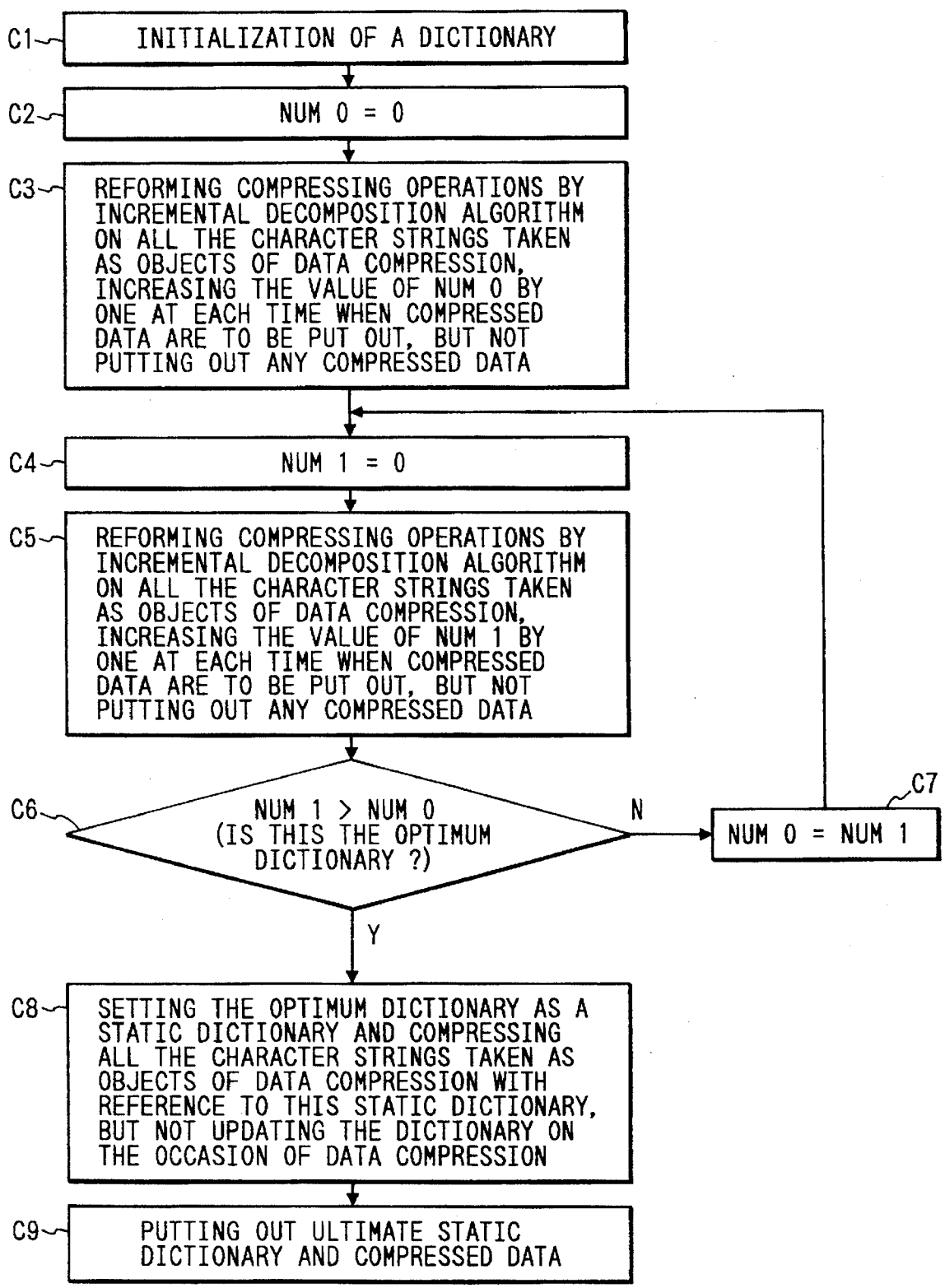
FIG. 5 is a flow chart for illustrating a method for compiling the optimum dictionary through utilization of an incremental decomposition algorithm.

FIG. 5 presents a flow chart for illustrating the method of compiling the optimum dictionary by utilization of an incremental decomposition algorithm. This method performs an initialization of the dictionary at the first step (the Step C1). By this operating step, the dictionary is set in a state where registered character strings are registered only in the registration numbers 0 through 255 in the dictionary. In specific terms, ASCII code characters are stored in the registration numbers 0 through 255. Next, the NUM0, which expresses the number of times of output of the compressed data, is set at NUM0=0 (at the Step C2). Thereafter, the system performs the data compressing process on all the character strings that are to be taken up as the objects of the data compression while updating the dictionary using the incremental decomposition algorithm, and, when the compressed data are to be put out, the system increments the value of the NUM0 by one at a time (at the Step C3). On this occasion, the system does not put out any compressed data to the outside. The reason is that the processing operation performed at the Step C3 is a process performed for the purpose of updating the dictionary.

Then, NUM1 is set at NUM1=0 (at the Step C4). After that, the system performs the same processing operation as at the Step C3, using the dictionary compiled ultimately at the Step C3. That is to say, the system will perform a data compressing operation on all the character strings that are taken up as the objects of the data compression while it keeps updating the dictionary by using an incremental decomposition algorithm, incrementing the value of the above-mentioned NUM1 by one at a time (at the Step C5) when the system has to put out the compressed data. Moreover, the system does not put out the compressed data itself on this occasion, either.

Next, the system judges (at the Step C6) whether or not NUM1>Num0. On the basis of the result of this operation, the system judges whether or not the data compression ratio has been optimized, i.e., whether or not the dictionary has been modified so as to be the optimum dictionary, by the processing operation performed at the Step C5. Then, if NUM1≦NUM0, the system finds that the dictionary is not yet modified so as to be the optimum dictionary, and the system sets NUM0=NUM1 (at the Step C7), repeating the processing operations at the Steps C4 and C5. NUM0 and NUM1 express the number of times of the output of the compressed data, and the smaller values of these NUM0 and NUM1 mean that the amount of data is small. Accordingly, NUM1≦to NUM0 means that the data compression ratio has been improved by the processing operation performed at the Step C5. Therefore, the processing operations at the Step C4 and the Step C5 are repeated further in this case. Then, when it is found that NUM1>NUM0 at the Step C6, it is judged that the dictionary has been compiled to be the optimum dictionary for the data compression.

Next, this optimum dictionary will be set up as a static dictionary, and, with reference to this static dictionary, the system compresses all the character strings to be taken up as the objects of the data compression (at the Step C8). Yet, on the occasion of such a data compression, the system does not perform any updating of the dictionary. The, finally, the system puts out the ultimate static dictionary and the data compressed with reference to the ultimate static dictionary are put out (at the Step C9).

Figure 6:
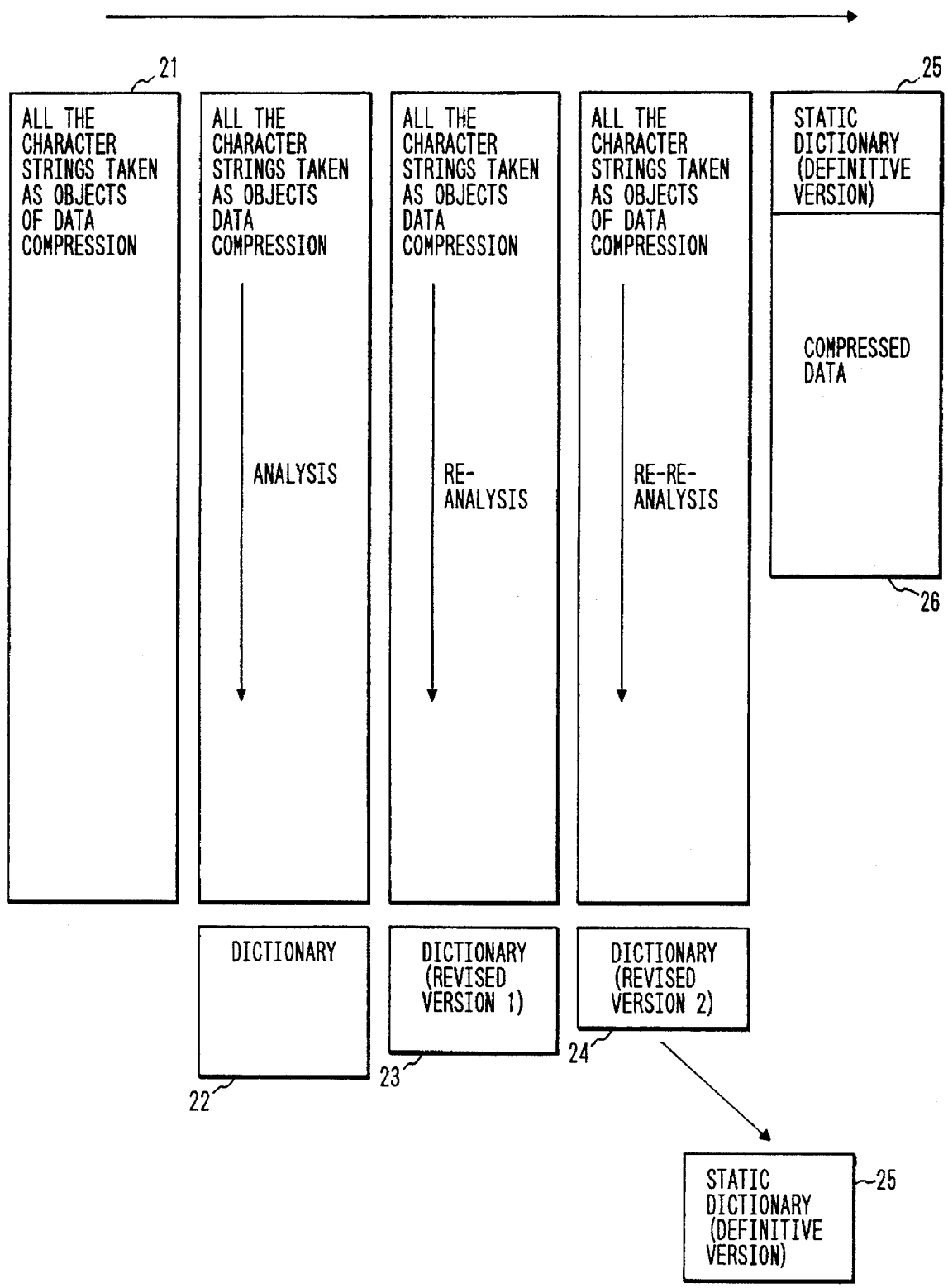
FIG. 6 is a chart for visually illustrating a process for producing a static dictionary and compressed data.

FIG. 6 presents a visual representation of the processing operations described above. All the character strings to be taken up as the objects of the data compression 21 are to be subjected to an analysis at a first time, and a tentative dictionary 22 is thereby compiled (and this dictionary is a dynamic dictionary). Next, all the character strings to be taken as the objects of the data compression 21 are to be subjected to a second analysis, by which a first updated version 1 of the dictionary 23 is compiled. Further the same procedure is performed, and a second updated version 2 of the dictionary 24 is thereby compiled. This updating procedure of the dictionary will be repeated until the system determines that the optimum dictionary has been compiled as judged on the basis of the compression ratio of the data in the dictionary thus updated, and, at this stage, the system adopts such an updated version of the dictionary as the definitive version of this dictionary, which the system then sets up as a static dictionary 25. Then, with this static dictionary 25, the system performs a data compressing process again on all the character strings to be taken as the objects of the data compression 21. However, the static dictionary 25 is kept in its static state on this occasion, and no updating of the dictionary will be performed. Now, the system puts out this static dictionary 25 and the compressed data to the outside and stores both of these in a memory device.

In this regard, the main differences between the method shown in FIG. 5 and FIG. 6 and the technique called LZW are as described below. The LZW system ultimately puts out only the compressed data as a product after the completion of a data compressing process, but does not put out any dictionary, which remains in its state of a dynamic dictionary. The LZW system is a data compressing method which is utilized in data communications via a telephone line, and the system at the transmitting side puts out compressed data by the LZW method and the system at the receiving side restores the compressed data thus transmitted to it. Then, on the occasion of the restoration of the compressed data thus transmitted, it is necessary for the system at the receiving side to restore the compressed data while recompiling a dynamic dictionary again out of the compressed data. Therefore, the LZW system will have to perform the processing operations in serial order from the beginning of the compressed data, and the LZW system works at a low data-restoring speed and, moreover, cannot make any random access to the necessary compressed data strings to restore them. For this reason, it is difficult to utilize the data compressed by the LZW method for any font data for a printer or the like.

In contrast with this, the method illustrated in FIG. 5 and FIG. 6 ultimately puts out both the compressed data and a static dictionary, in a manner of operation unlike that of the LZW method. Accordingly, it is not necessary for the system to compile the dictionary again at the time of any restoration of the compressed data, and this system can therefore attain a higher speed in restoring the compressed data. Further, the use of a static dictionary enables the system also to make its random access to any desired data string in the compressed data. Furthermore, the advantages of a higher data-restoring speed and the capability of making random access to the data strings are advantages available not only to this third method but also to the first method and the second method described above and also to the fourth method to be described later.

(D) Fourth Method for Producing the Optimum Dictionary

This method produces the optimum dictionary through its utilization of an augmentative decomposition algorithm. As regards the augmentative decomposition algorithm, a detailed description will be given in the second example of preferred embodiment of the present invention. However, the flow itself of the processing operations by the fourth method is almost the same as the flow shown in FIG. 5, with the exception that the data compression at the Steps C3 and C5 is performed by an augmentative decomposition algorithm.

The third method described above can produce compressed data at a high compression ratio owing to the performance of the data compressing process through utilization of an incremental decomposition algorithm, but, since the method includes a process for registering a character string by registering one character after another, and, consequently, it can never be said that the third method can attain any high processing speed, and the incremental decomposition algorithm cannot achieve any high data compression ratio in comparison with the augmentative decomposition algorithm. Therefore, it is desirable to employ the fourth method which utilizes this augmentative decomposition algorithm in case it is intended to attain a higher data compression ratio.

Moreover, in the first method through the fourth method mentioned above, the compressed data are put out in the form of a code in a fixed bit length. This code is in the form of one word composed of 12 bits or 16 bits, for example. Then, in a case where the compressed data are produced in the form of one word composed of 16 bits, the data form offers the merit that it achieves an improvement on the data processing speed, but, on the other hand, it produces the demerit that the data compression ratio is lower than in the case in which one word is composed of 12 bits.

As described above, the system in this example of preferred embodiment takes a longer period of time for the processing operations because it is necessary for the system to delete the registered entries in the dictionary on the basis of the frequency of their usage for the compilation of the optimum static dictionary and to scan the data for a plural number of times at the time when a data compressing operation is performed. However, such a longer processing time does not present any problem to the user. That is to say, the performance of a data compressing operation is required when the data are written to a non-rewritable memory device or memory medium (such as a ROM), and this does not give any influence at all to the processing time at the time of a data restoring operation, which is performed after a data compression. In specific terms, the speed of a data restoring operation, which is to be performed in case the user desires to have characters printed, will not be extended particularly when he operates the system to print characters by using a printer mounted with a memory medium which stores data as compressed by the particular data compressing method mentioned above although it takes much time for the system at the maker side to prepare compressed data by the particular data compressing method described in this example of embodiment.

2. Second Embodiment (A) Augmentative Decomposition Method

Figure 7:
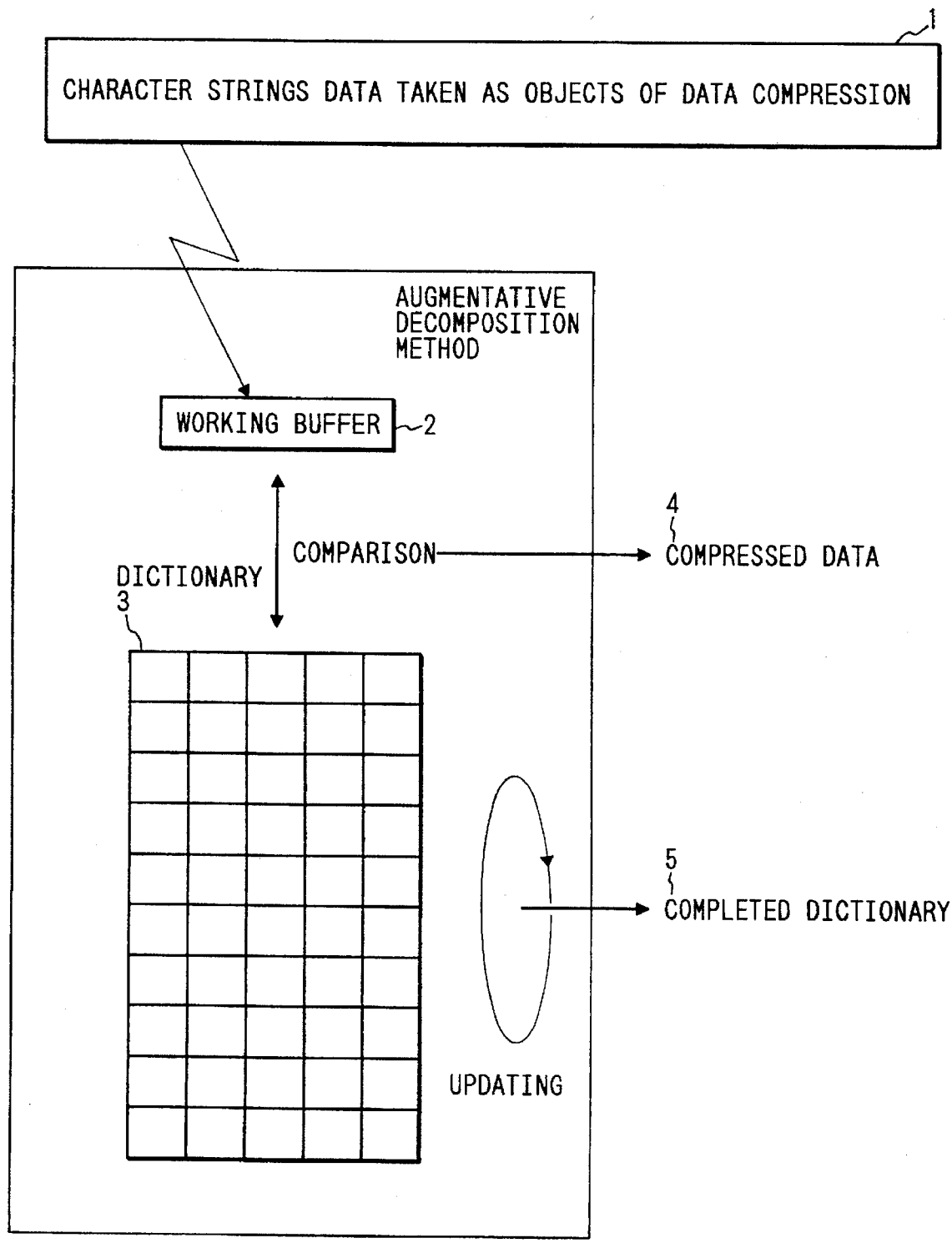
FIG. 7 is a schematic drawing for furnishing a typical illustration of a data compressing method which is employed in the processing operations described in a second embodiment of the present invention.

FIG. 7 presents a chart which schematically illustrates the data compressing method (be hereafter referred to as "the augmentative decomposition method" or "the augmentative decomposition algorithm") which is to be used in this second example of preferred embodiment.

The character string data 1 to be taken up as the object of a data compressing process is stored successively as from the beginning segment in the string of the data into a working buffer 2, which is a working memory means. Next, the system determines whether or not any of the character strings stored in the working buffer 2 is present in the character strings registered in the dictionary 3 through comparison of the character strings stored in the above-mentioned working buffer 2 with those registered in the dictionary 3. If any character string is present in both of these, the system updates the information contained in the above-mentioned dictionary 3 and also replaces the particular character string present in the working buffer 2, then adding the next character string to be taken as the object of a data compression to the character strings contained in the working buffer 2. In the meantime, the system registered the initial two characters found present in the working buffer 2 in the dictionary 3 mentioned above in case no character string stored in the working buffer is registered in the dictionary 3 and puts out the initial one character as the compressed data 4. Then, the system adds the next character string to be taken up as the object of a data compression to the above-mentioned working buffer 2, and the system compares the character strings stored in the working buffer 2 with the character strings registered in the above-mentioned dictionary 3, thereby determining whether or not any character string stored in the working buffer 2 is registered in the dictionary 3. This method performs data compression by repeating the processing operations described above.

Next, a detailed description will be given with respect to a case in which the system performs processing operations on the character string shown below as the object for the data compression, using the augmentative decomposition method, and thereby produces a static dictionary and compressed data. Here, the character string to be taken up as the object of the data compression is:

"ABCEBCHA, BBCCDBCH, ABCABEHD, ABBCGABK, ..."

However, it is assumed here that the character data in the ASCII code are registered in the entries No. 0 through No. 255 in a dictionary composed of a rewritable memory element. Further, it is assumed that a buffer having the capacity of 16 bytes is provided in the working memory means.

(1) First, the system takes into the working buffer the data for the capacity (16 bits) of the working buffer as from the beginning of the character string data which is taken up as the object of the data compression. Then, the character string stored in the working buffer will be: "ABCEBCHA, BBC-CDBCH". Here, each of the characters is composed of data which represents a numerical value each expressed in one byte, and the numerical value is to be identified with reference to the ASCII code table, as mentioned above. For example, "A" is expressed by 65, "B" is expressed by 66, and "C" is expressed by 67.

(2) Next, the system examines whether or not there is any character string composed of two or more characters (or a combination of such character strings) already registered in the dictionary is found to be present in this working buffer. However, as no such character string is registered in the dictionary, the system registers the two characters "AB" in the initial part of the character string in the data column as 65+66 (i.e., the ASCII codes for "A" and "B") in the length of two (characters) in the entry No. 256 in the dictionary, setting the frequency of usage for this character string at one for the character string now registered in the entry No. "256". Further, the system puts out as compressed data the registration No. "65" for the initial single character "A" stored in the working buffer, then deleting the character from its storage in the working buffer. Thereafter, the system shifts all the character strings subsequent to the deleted character in the direction of the foremost part in such a manner as to fill up the one-byte empty space which has appeared in the working buffer as the result of the above-mentioned mentioned deletion of the character therefrom and then takes "A" for one character portion from the subsequent part of the character string taken as the object of the data compression into the empty one-byte space appearing as the result of the shift in the end part of the working buffer. Then, the character string stored in the working buffer becomes "BCEBCHAB, BCCDBCHA".

(3) Next, the system examines again whether or not any character string which, being composed of two or more characters, is registered in the dictionary is found to be present in this working buffer. Then, since the character string "AB" is present in the seventh and eighth character positions in the working buffer, the system replaces the above-mentioned character string, "AB," which occupies a space for two characters, with the characters 256, then updating the frequency of usage for the character string in the entry No. "256" in the dictionary to "two times". This replacement results in the appearance of a one-byte empty space in the working buffer, so that the system shifts all the character strings subsequent to that in the direction of the foremost position in the working buffer and takes one character "B" from the subsequent part of the character string taken up as the object of the data compression to fill the empty one-byte space which appears in the end part of the working buffer as the result of the above-mentioned shift of all the character strings. Then, the character string present in the working buffer becomes "BCEBCH256 B, CCDBCHAB".

(4) The system examines again whether or not any character string composed of two or more characters and already registered in the dictionary is present in this working buffer. Then, it is found that the character string, "AB," is present in the 15th and 16th character positions in the working buffer, and the system therefore replaces the above-mentioned character string, "AB," which corresponds to two bytes in length, with the character "256" and updates the frequency of usage of the character string in the entry No. "256" in the dictionary to "three times." By the effect of this replacement, there appears an empty space for one byte in the working buffer, and the system therefore shifts all the subsequent character strings in the direction of the foremost part, thereby filling up the empty space, and takes one character portion "C" from the subsequent portion of the character string taken as the object of the data compression into the empty one-byte space appearing at the end part of the working buffer as the result of the shift mentioned above. Then, the character string in the working buffer will be "BCEBCH256 B, CCDBCH256 C".

(5) The system examines again whether or not any character string composed of two or more characters and already registered in the dictionary is present in this working buffer. However, since no such character string is registered in the dictionary, the system registers the initial two characters, "BC," which corresponds to two characters in length, as 66+67 in the data column, for example, in the entry No. 257 in the dictionary, and sets the frequency of usage of the entry No. "257" at "one time". In addition, the system puts out the registration number "66", which is in the form of compressed data, for the initial one character present in the working buffer, deleting the registration number "66" for the character "B" from its storage in the working buffer, then shifting all the character strings subsequent to it in the direction toward the foremost part so as to fill up the empty one-byte space which has appeared as the result of the deletion in the working buffer, and then taking one character portion "A" from the subsequent part of the character string to be taken as the object of the data compression and putting the character into the empty one-byte space appearing in the end part of the working buffer as the result of the above-mentioned shift of the character strings. Then, the character string in the working buffer will be "CEBCH256 BC, CDBCH256 CA".

(6) The system examines again whether or not any character string which, being composed of two or more characters, is already registered in the dictionary is present in the working buffer. Then, the system finds that the character string "BC" is present in the third and fourth character positions, in the seventh and eighth character positions, and in the eleventh and twelfth character positions in the working buffer, and the system therefore replaces each of the character string "BC" mentioned above, which corresponds to six characters in total, respectively with the characters "257" and sets the frequency of usage for the character string in the entry "257" in the dictionary at "four times". This replacement results in the appearance of an empty space of three bytes in the working buffer, and the system shifts all the character strings subsequent to it in the direction of the foremost portion so as to fill up the empty space, and also takes a portion for the three characters "BEH" from the subsequent portion of the character string taken as the object of the data compression, filling the three characters into the empty three bytes formed at the end part of the working buffer as the result of the above-mentioned shift of the character strings in it. Then, the character string in the working buffer will be "CE257 H256257CD, 257 H256 CABEH".

(7) The system examines again whether or not there is any character string which, being composed of two or more characters, is already registered in the dictionary is present in this working buffer. Then, the system finds that the character string "AB" is present in the thirteenth and fourteenth character positions in the working buffer, and the system therefore replaces the above-mentioned character string "AB," which corresponds to two bytes in length, with the character 256, and updates the frequency of usage of the character string in the entry No. "256" in the dictionary to "four times". By this replacement, an empty space for one byte appears in the working buffer, and the system therefore shifts all the character strings subsequent to it in the direction of the foremost part, then taking one character portion "D" from the subsequent portion of the data in the character string taken as the object of the data compression and filling it in the empty one byte appearing at the end of the working buffer as the result of the shift. Then, the character string in the working buffer will be "CE257 H256257CD, 257 H256 C256 EHD".

(8) The system examines again whether or not any character string which is composed of two or more characters and already registered in the dictionary is present in this working buffer. However, since no such character string is registered in the dictionary, the system registers the initial two characters "CE," which corresponds to two (characters) in length as 67+69 in the data column, for example, in the entry No. 258 in the dictionary, setting the frequency of usage of this character in the entry "258" at "one time". Further, the system puts out in the form of compressed data a registration number "67" for the one character "C" present in the initial part of the working buffer, then deleting the character in the working buffer, then shifting all the character strings subsequent to it in the direction of the foremost part, so as to fill the empty one-byte space which has appeared in the working buffer as the result of the deletion and then taking the one character portion "A" from the subsequent portion of the data in the character string taken as the object of the data compression and filling it in the empty one byte which has appeared at the end of the working buffer as the result of the above-mentioned shift of the character strings. Then, the character string in the working buffer will be "E257 H256257 CD257, H256 C256 EHDA".

(9) The system examines again whether or not any character string which is composed of two or more characters and is registered in the dictionary is present in the working buffer. However, since no such character string is registered in the dictionary, the system registers the initial two characters "E257," which corresponds to two characters in length, as 69+257 in the data column, for example, at the entry No. 259 in the dictionary, setting the frequency of usage of this registered entry at this entry "259" at "one time". In addition, the system puts out in the form of compressed data the registration number "69" for the one character "E" in the initial part of the working buffer, then deleting the character from its storage in the working buffer and shifting all the character strings subsequent to it in the direction of the foremost part, so as to fill the empty one byte appearing in the working buffer as the result of this deletion, and taking one character "B" from the subsequent portion of the character string taken as the object of the data compression and filling the empty one byte formed in the end part of the working buffer as the result of the above-mentioned shift of the character strings. Then, the character string in the working buffer will be "257 H256257CD257, H256 EHDAB".

(10) The system examines once again whether or not there is any character string which is composed of two or more characters and registered in this working buffer. Then, it is found that a character string "AB" is present in the fifteenth and sixteenth character positions in the working buffer, and the system therefore replaces the character string "AB," which corresponds to two bytes, with the character "256" and sets the frequency of usage of the character string at the entry "256" at "four times". This replacement results in the formation of an empty one byte space in the working buffer, and the system shifts all the character strings subsequent to it in the direction of the foremost part so as to fill up the empty space appearing as the result of the replacement, and the system then takes one character portion "B" from the subsequent portion of the data in the character string taken up as the object of the data compression and puts the character in the empty one byte appearing in the end part of the working buffer as the result of the above-mentioned shift of the character strings mentioned above. Then, the character string in the working buffer will be "257 H256257 CD257, H256 C256 EHD256 B".

(11) The system examines again whether or not any character string which is composed of two or more characters and is already registered in the dictionary is present in the working buffer. However, the system finds that no such character string registered in the dictionary is present in the working buffer, and the system therefore registers the initial two characters "257H," which corresponds to two characters in length, as 257+72, for example, at the entry number 260 in the dictionary, setting the frequency of usage of this registered entry at "one time". Further, the system puts out the one character "257" in the initial part of the working buffer as the compressed data, then deleting the character from its storage in the working buffer and shifting all the character strings subsequent to it in the direction of the foremost part of the working buffer, and then taking one character "C" from the subsequent portion of the character string taken as the object of the data compression and putting the character into the empty one byte formed at the end part of the working buffer as the result of the above-mentioned shift of the character strings. Then, the character string in the working buffer will be "H256257 CD257H, 256 C256 EHD256 BC".

(12) The system examines again whether or not any character string which is composed of two or more characters and is registered in the dictionary is present in the working buffer. Then, the system finds that the character string "257H" is present in the seventh and eighth character positions in the working buffer and that the character string "BC" is present in the fifteenth and sixteenth character positions in the working buffer, and the system, therefore, replaces the character string "257H" with the character 260 and also replaces the character string "BC" with the character 257, updating the frequency of usage of "260" in the dictionary at "two times" and updating the frequency of usage of "257" at five times. As this replacement produces an empty space for two bytes in the working buffer, the system shifts all the character strings subsequent to it in the direction of the foremost part of the working buffer, so that the empty space may be filled up, and the system also takes "GA," which corresponds to two characters, from the subsequent portion of the character string which is taken up as the object of the data compression and puts the characters in the empty two bytes formed in the end part of the working buffer as the result of the above-mentioned shift of the character strings. Then, the character string in the working buffer will be "H256257 CD260256C, 256EH D256247GA".

(13) The system examines again whether or not any character string which is composed of two or more characters and is registered in the dictionary is present in the working buffer. Then, the system finds that no such character string is registered in the dictionary, and the system then registers the initial two characters "261," which corresponds to three characters in length, as 72+256 in the data column, for example, at the entry No. 261 in the dictionary, setting the frequency of usage of this registered entry at this entry "261" at "one time". In addition, the system puts out in the form of compressed data the registration number "72" for the one character "H" in the initial part of the working buffer, then deleting the character from its storage in the working buffer and shifting all the character strings subsequent to it in the direction of the foremost part, so as to fill the empty one byte appearing in the working buffer as the result of this deletion, and taking the character "B" for one character from the subsequent portion of the character string taken as the object of the data compression and filling the empty one byte formed in the end part of the working buffer as the result of the above-mentioned shift of the character strings. Then, the character string in the working buffer will be "256257C D260256C256, EHD256257 GAB".

(14) The system examines again whether or not any character string which is composed of two or more characters and is registered in the dictionary is present in the working buffer. Yet, the system finds that no such character string is registered in the dictionary, and the system then registers the initial two characters "256257," which corresponds to four characters in length, as 256+257 in the data column, for example, at the entry No. 262 in the dictionary, setting the frequency of usage of this registered entry at this entry "262" at "one time". In addition, the system puts out in the form of compressed data the registration number for the one character "256" in the initial part of the working buffer, then deleting the character from its storage in the working buffer and shifting all the character strings subsequent to it in the direction of the foremost part, so as to fill the empty one byte appearing in the working buffer as the result of this deletion, and taking the character "K" for one character from the subsequent portion of the character string taken as the object of the data compression and filling the empty one byte formed in the end part of the working buffer as the result of the above-mentioned shift of the character strings. Then, the character string in the working buffer will be "257 CD260256C 256 E, HD256257, ED256257 ABK".

(15) The system examines again whether or not any character string which is composed of two or more characters and is registered in the dictionary is present in the working buffer. Then, the system finds that the character string "256257" is present in the eleventh and twelfth character positions in the working buffer, and the system replaces the character string "256257" with the character 262, updating the frequency of usage of "262" in the dictionary at "two times". As this replacement produces an empty space for one byte in the working buffer, the system shifts all the character strings subsequent to it in the direction of the foremost part of the working buffer, so that the empty space may be filled up, and the system also takes one character from the subsequent portion of the character string which is taken up as the object of the data compression, then putting the character in the empty one byte formed in the end part of the working buffer as the result of the above-mentioned shift of the character strings. Then, the character string in the working buffer will be "257 CD260256C256 E, HD256GABK".

As described in the foregoing part, the augmentative decomposition method in this example of preferred embodiment takes the data in serial order out of the data in a character string taken as the object of a data compression in order to keep the length of a character string in the working buffer constant at all times. Now, the system examines whether or not any combination of any adjacent character strings from the initial part in the working buffer is registered in the dictionary, and, if there is any such combination of character strings present in the working buffer is registered in the dictionary, the system then replaces the registered character strings with registration numbers in the dictionary, thereby performing the data compression of such character strings. Further, if any combination of these character strings is included in the working buffer, the system performs a further compression of data by replacing any combination of these character strings with registration numbers in the dictionary. Accordingly, the compressed data has a reduced amount of data as compared with the amount of compressed data produced in the case of a data compression by the conventional incremental decomposition method, and this augmentative decomposition is thus eventually capable of storing the compressed data with a smaller capacity of memory. Moreover, the compressed data are put out after each particular combination of character strings is registered in the dictionary in case any given combination of adjacent character strings from the foremost part in the working buffer is not yet registered in the dictionary.

Figure 8A:
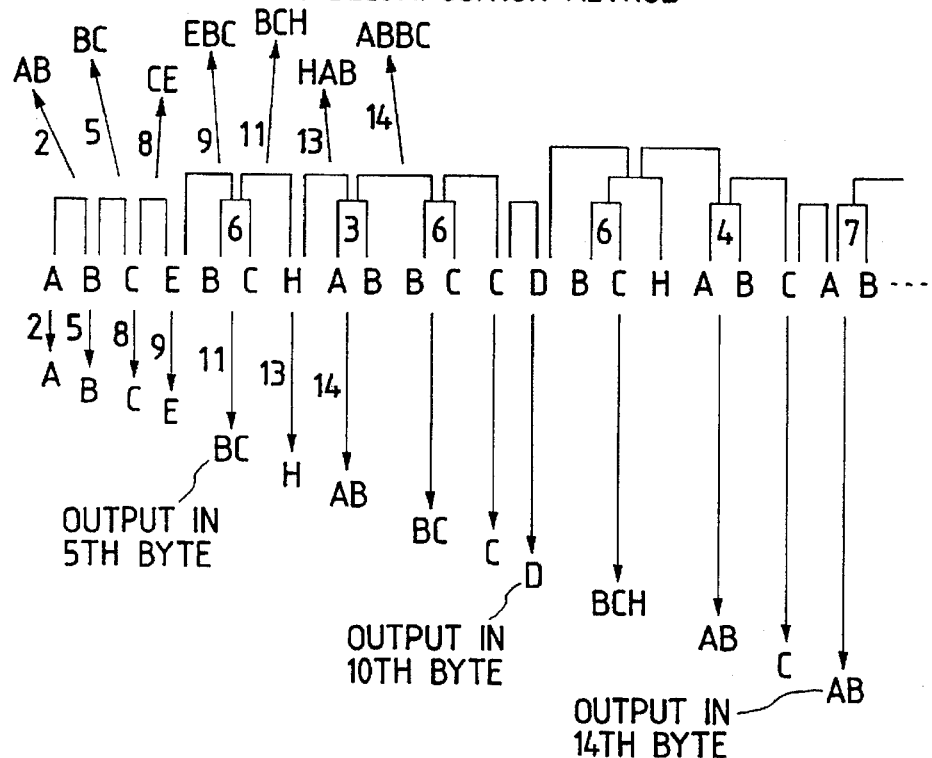
FIGS. 8(A) and 8(B) are schematic drawings for furnishing a typical illustration of the differences which are present between the incremental decomposition method and the augmentative decomposition method.

The processing operations described above may be represented schematically in a tree structure as in FIG. 8(A). FIG. 8(A) has the reference numbers assigned to the component parts in accordance with the reference numbers from (1) to (15) as used in the description given above. However, the reference numbers (1), (10), (12), and (15) are not used in FIG. 8(A).

For example, the operating process described in (2) above for registering the character string "AB" in the dictionary and then putting out "A" is expressed in FIG. 8(A) as shown below. That is to say, the characters "AB" indicated ahead of the upward pointing arrow mark means the registration of the character string in the dictionary. Also, the character "A" indicated ahead of a downward pointing arrow mark expresses that the particular character is to be put out by a compressed data, and the annexation of the process number "2" near the upward pointing arrow mark and the downward pointing arrow mark expresses that the particular process is to be performed in the process (2).

Moreover, as in the process of (3) above, in case the characters "AB" registered in the dictionary is found among the working buffers and is replaced with a registration number, the area above the character string to be thus replaced is tied together and the number for the process in which the particular processing operation is performed, "3" in this case, is attached there.

In this regard, the output data as compressed will be as shown below in the case of this example of preferred embodiment:

"A, B, C, E, 257, H, 256, 257, C, . . ."

Further, the following character strings will in effect be registered in the dictionary:

| | |
|---|---|
| 0 to 255 | ASCII Code |
| 256 | AB |
| 257 | BC |
| 258 | CE |
| 259 | E257 |
| 260 | 257 H |
| 261 | H256 |
| 262 | 256   257 |
| . | . |
| . | . |
| . | . |

(B) Incremental Decomposition Method

Next, a description will be given of a case in which the data of the following character string, which are the same as the data used in the example of embodiment given above, are processed by a process using the conventional incremental decomposition method and a dictionary and compressed data are obtained. However, it is assumed also here that ASCII Code characters are recorded in the entries 0 to 255 in the dictionary from the beginning.

"ABCEBCHA, BBCCDBCH, ABCABEHD, ABBC- GABK . . ."

(1) The character strings which come transmitted are not stored once in every fixed number of bytes in the working buffer as in the case of the augmentative decomposition method described above, but the necessary minimum number of character strings in the initial portion are taken into the working buffer. Then, the system examines whether or not the "A," which is in the first character position in this working buffer, is stored in the dictionary. Then, it is found that the particular "A" is registered in the entry number 65 in the dictionary, so that the system sets the frequency of usage of "A" at "1."

(2) Next, the second character "B" is added, and the system examines whether these characters "AB" which are present in the working buffer are registered in the dictionary. However, it is not found that there is any character composed of two or more characters and already registered in the dictionary. Therefore, the system registers the initial two characters "AB" at the entry No. 256, the length being 2 (characters), with 65+66 entered in the data column in the dictionary, setting the frequency of usage of the entry "256" in the dictionary being set at "one time". Next, the system puts out, in the form of compressed data, the particular "A" which is in the initial part of the working buffer, and next the system focuses attention as from "B" in the second character position in the data of the character string to be taken as the object of the data compression.

(3) The system first examines whether or not a new initial one character "B" is registered in the dictionary. Then, the system finds that the particular "B" is registered at the entry No. 66 in the dictionary, and the system therefore sets the frequency of usage of the character "B" at "1".

(4) Next, the system adds a new second character "C" and examines whether or not the string formed of these characters "BC" as stored in the working buffer is registered in the dictionary. However, the system does not find any character string composed of two or more characters and also already registered in the dictionary. Therefore, the system registers the initial two characters "BC" at the entry No. 257 in a length of two (characters), as 66+67 set in the data column, setting the frequency of usage of "257" in the dictionary at "one time". Next, the system puts out the particular "B" in the beginning of the working buffer in the form of compressed data, then focusing attention to the subsequent characters as from the third character "C" in the character string taken as the object of the data compression.

(5) The same procedure as what has been described above will be continued in repetition to the character "E" in the fourth character position from the beginning of the character string and, after having registered the character string "EB," the system examines whether or not a new character "B" now in the initial position of the character string is registered in the dictionary. However, as the "B" mentioned above is registered in the 66th entry in the dictionary, the system now sets the frequency of usage of the character "B" at "2".

(6) Next, the system adds a new second character "C" and examines whether or not this character string "BC" present in the working buffer is registered in the dictionary. Then, the system finds at this time that the characters "BC" are registered in the entry "257" in the dictionary, and the system therefore sets the frequency of usage of the character string "BC" at "two times". Then, the system further examines whether a character string "BCH," which is composed by adding a new third character "H" to the character string "BC," is registered in the dictionary.

(7) Then, the system finds that this character string "BCH" is not registered in the dictionary, and the system therefore registers this character string "BCH" which is composed of the three characters in the entry 260 in a length for three characters in the dictionary as 257+72, setting the frequency of usage of the entry "260" at "one time". Next, the system puts out, in the form of compressed data, the registration number "257" for the character string "BC" in the initial part and then focuses attention to "H" in the seventh character position in the character string taken as the object of the data compression.

Figure 9:
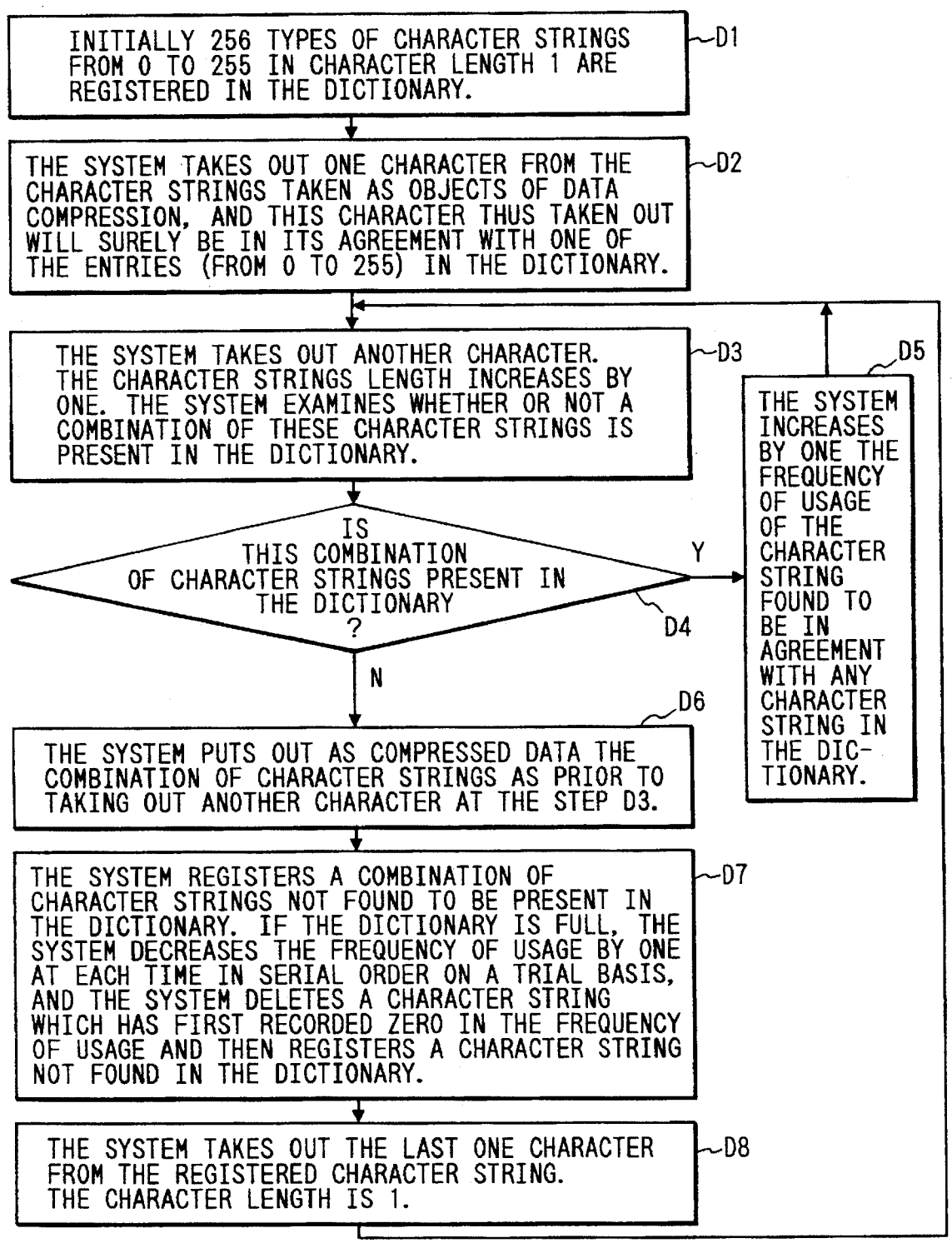
FIG. 9 is a flow chart for illustrating the processing operations performed in accordance with the incremental decomposition method.

For additional information, FIG. 9 shows a flow chart illustrating the operation of the incremental decomposition method described above.

The incremental decomposition method is performed in the manner described above, but a major difference between the incremental decomposition method described above and the augmentative decomposition method described in this example of preferred embodiment is to be found in the point that the augmentative decomposition method according to the present invention takes one character at a time out of the data of the character string taken as the object of the data compression and examining the agreement of the particular character with an entry registered in the dictionary.

Figure 8B:
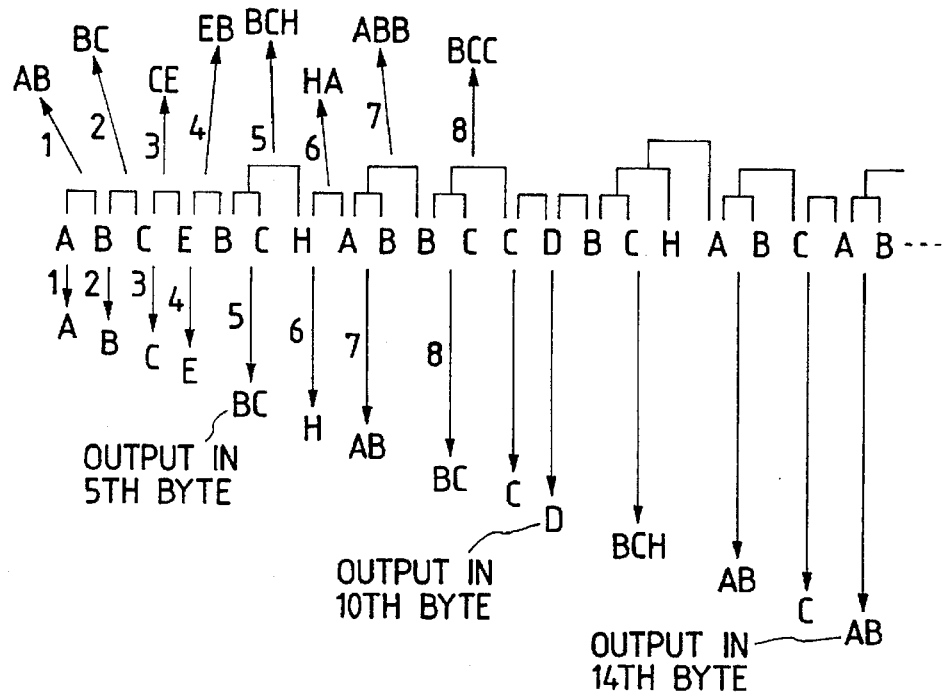

The processing operations described above are represented schematically in the form of a tree structure in FIG. 8(B) in the same manner as in FIG. 8(A). However, the reference numbers 1 to 8 in this FIG. 8(B) do not agree with the those used in the description made above of the operating procedure of the data compressing method. Here, for example, in respect to the processing operation 1 for registering "AB" in the dictionary and putting out "A," "AB" is written ahead of the upward pointing arrow mark to express its registration in the dictionary while "A" is written ahead of the downward pointing arrow mark to express the output of the particular character in the form of compressed data.

Now, as it can be understood with reference to FIG. 8(B), the conventional incremental decomposition method cannot operate with any such process as finding the characters "AB" registered in the dictionary in a position other than the foremost character position in a character string stored in the working buffer and then replacing the characters with a registration number as in the process (3) shown in FIG. 8(B). What can possibly be accomplished by the conventional method is merely adding one character to the right side of a character string which is registered in the dictionary and forming a new character string by putting the character string and the added character together as in the process indicated by "5" in FIG. 8(B).

In this regard, the output data as compressed by this incremental decomposition method is as shown in the following part:

"A, B, C, E, 257, H, 256, 257, C, D, 257, H, 256, . . ."

Moreover, the following character strings will eventually be registered in the dictionary:

| 0 to 255 | ASCII Code |
|---|---|
| 256 | AB |
| 257 | BC |
| 258 | CE |
| 259 | EB |
| 260 | 257 H |
| 261 | HA |
| 262 | 256 B |
| 263 | 257 C |
| 264 | CD |
| 265 | DB |
| 266 | 260 A |
| . | . |
| . | . |
| . | . |

A comparison of FIG. 8(A) with FIG. 8(B) reveals that the compressed data put out by the systems which respectively operate by the two data compressing methods are the same so far as the compressed data are viewed in the range described in the examples, but they are surely different in terms of the specific character strings registered in the dictionary, and the character strings to which attention is focused will have increasing differences according as the character string on which attention is focused in the processing operation shifts toward the rear portion of the character string taken as the object of the data compression.

Figure 10A:
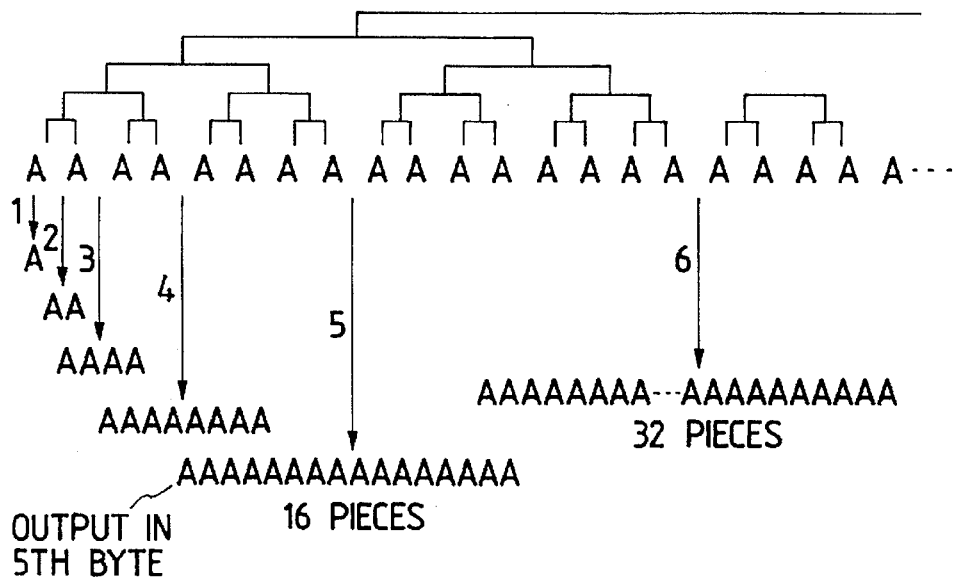
FIGS. 10(A) and 10(B) are charts which respectively furnish a typical illustration of the differences in the processing operations between the incremental decomposition method and the augmentative decomposition method.
Figure 10B:
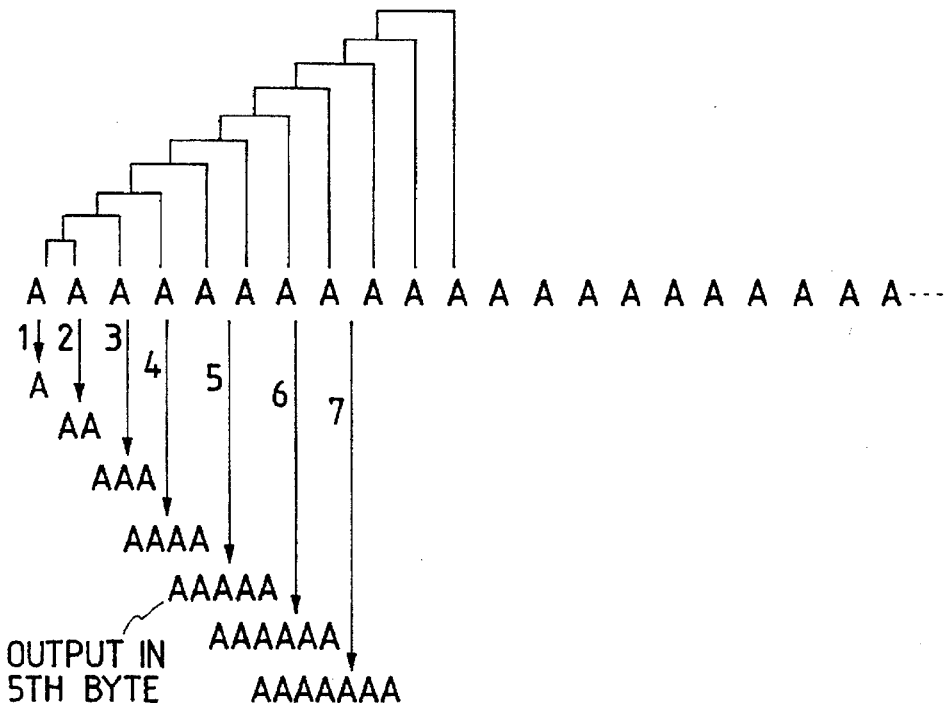

As described in the foregoing part, the conventional incremental decomposition method can increase the registered character string only by one character at a time, and there will be a considerable difference between the conventional incremental decomposition method and the augmentative decomposition method described in this example of preferred embodiment particularly in the data compression of the data in a character string consisting of identical character strings in succession as shown in FIG. 10(A) and in FIG. 10(B), and the augmentative decomposition method in this example can store the compressed data with a smaller memory capacity.

FIG. 10(A) illustrates a case in which the data in successive character strings are compressed by the augmentative decomposition method described in this example of preferred embodiment, and FIG. 10(B) illustrates a case in which the data in successive character strings are compressed by the incremental decomposition method. In the case of the incremental decomposition method shown in FIG. 10(B), the character strings are registered in the dictionary in the serial order of A, AA, AAA, AAAA, AAAAA, AAAAAA, ..., and it is therefore necessary for the system to perform the output operation sixteen times and to perform the registering operation of the character strings in the dictionary seventeen times for completing the processing operations for compressing the data for the sixteen bytes of the characters "A". On the other hand, the augmentative decomposition method in this example of preferred embodiment performs the registrations of character strings in the dictionary in the serial order of A, AA, AAAA, AAAAAAAA, AAAAAAAAAAAAAAAA, ..., the system is required to perform the output operation only five times and to perform the registering operation of the character in the dictionary for completing the processing operations for compressing the data for the sixteen bytes of the characters "A".

In the case of a character string in which the same characters appear in succession in the manner described above, the augmentative decomposition method described in this example of preferred embodiment demonstrates an evident effect, and the data compression ratio achieved by this method is much higher than the data compression ratio achieved by the conventional incremental decomposition method. In other words, this means that the data compressing method in this example of embodiment can process the same amount of data in character strings with a smaller number of times of the output operation. Then, since this method puts out the character strings at the time of an output operation by surely replacing a character string with a registration number in bytes in a fixed length as registered in the dictionary, a smaller number of times of output means a smaller byte length and that the amount of compressed data is accordingly smaller.

(C) Compilation of the Optimum Dictionary

The processing operations performed by the augmentative decomposition method described above will be performed for a plural number of times on all the character strings taken as the objects of the data compression, in the same manner as in the case shown in FIG. 6 mentioned above, and the system thereby compiles an optimum dictionary with which the system can perform a data compressing process in the most efficient manner. In the following part, the processing operations to be performed on the dictionary for its optimization will be described with reference to FIG. 11 and FIG. 12.

Figure 11:
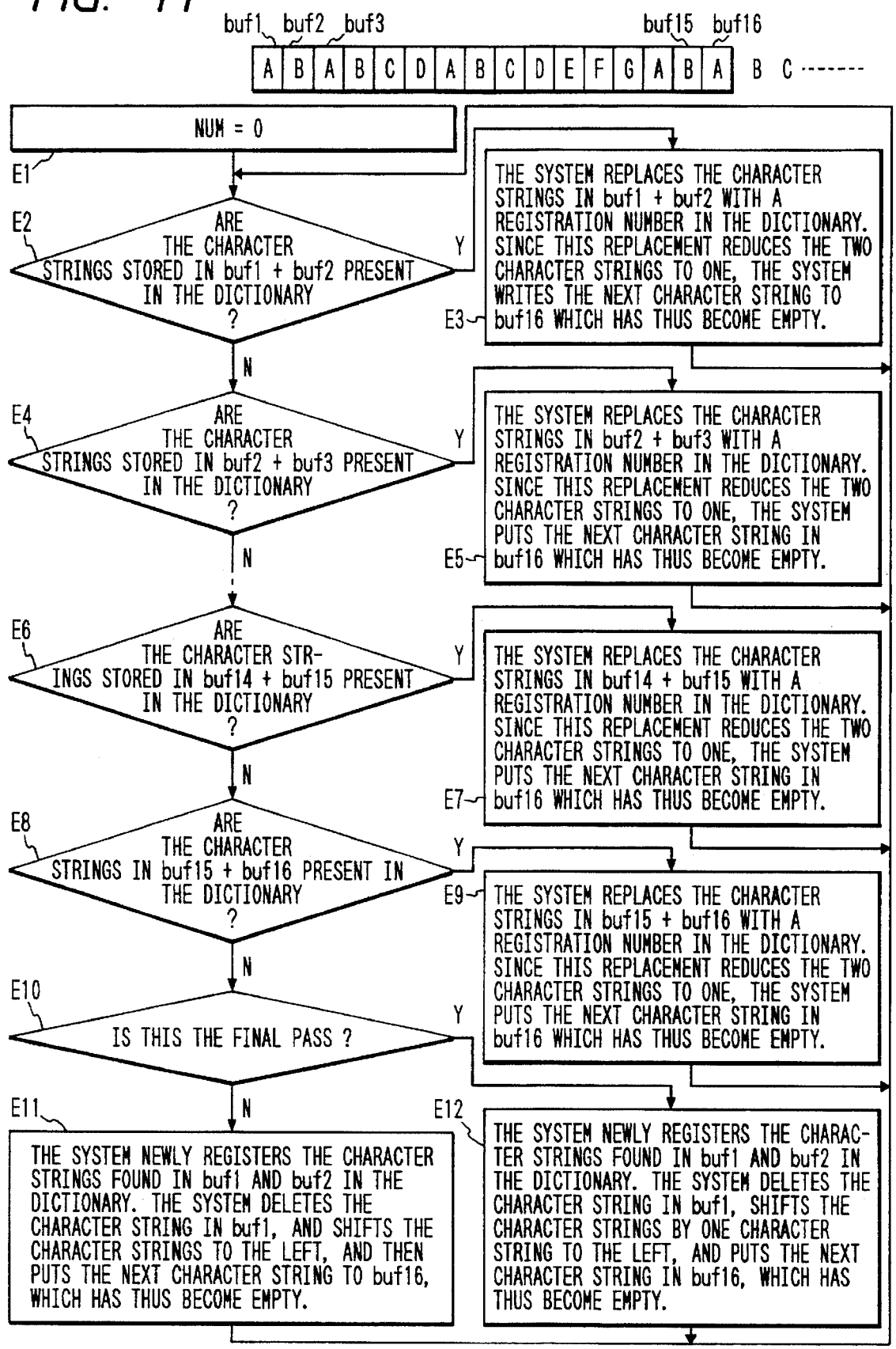
FIG. 11 is a flow chart for illustrating the processing operations to be performed in one pass by the augmentative decomposition method.

The flow chart presented in FIG. 11 illustrates the processing operation performed in one pass in accordance with the augmentative decomposition method for the optimization of the dictionary. Here, "one pass" means the course from the storing of all the character strings in the working buffer to the completion of the processing operations on all the stored character strings. First, as shown in FIG. 11, the system sets NUM=0 (at the Step E1). Then, the system examines whether or not the combination of character strings (i.e., AB) stored in the buf1 and the buf2 (i.e., the first byte and the second byte in the working buffer) is already registered in the dictionary (the Step E2). In case the system determines that the combination of the character strings is registered in the dictionary, the system replaces the combination of the character strings stored in these buf1 and buf2 with a registration number in the dictionary, and then stores the next character string (i.e., "B") in the buf16 (the Step E3), which has become empty as the result of this replacement. Thereafter, the system returns to the Step E2 and examines again whether or not the combination of the character strings stored in the buf1 an the buf2 is already registered in the dictionary.

In the meanwhile, in case the system finds at the Step E2 that the combination of the character strings in the buf1 and the buf2 is not registered in the dictionary, then the system further examines whether or not the combination of the character strings stored in the buf2 and the buf3 is already registered in the dictionary (the Step E4). Then, in case the combination of the character strings is registered in the dictionary, the system moves on to the Step E5 and returns thereafter to the Step E2. In case the combination of the character strings is not registered in the dictionary, the system moves on to the next step.

The system continues examining the combinations of the character strings up to those character strings stored in the buf15 and the buf16 (the Step E8), and, in case none of the combinations of the character strings is registered in the dictionary, the system examines whether or not the pass at this time is a final pass, referring to the final pass flag (the Step E10). If the pass is not any final pass, then the system moves on to the Step E11, at which the system registers the combination of the character strings in the buf1 and the buf2 as a new entry in the dictionary. Then, the system deletes the character string stored in the buf1 and, at the same time, shifts the character strings stored in the working buffer to the left, and stores the next character string in the buf16 so as to fill the empty space which has resulted from the above-mentioned shift. Further, the system sets NUM=NUM+1, thereby incrementing the value of the NUM by one, and, after that, the system returns to the Step E2. In the meantime, in case the system finds that it has finished the final pass at the Step E10, the system puts out the character string in the buf1 in the form of compressed data to the outside, then deleting the character string stored in the buf1, shifting the character string to the left by one character, and filling the next character string in the buf16 (the Step E12), which has become empty as the result of the above-mentioned deletion of the character string.

In FIG. 11, moreover, the system returns to the Step E2, for example, after finishing the processing operations at the Step E8 and the Step E9, but the present invention does not necessarily require the system to return to the Step E2. That is to say, it is only those character strings stored in the buf15 and the buf16 that are replaced, it is sufficient for the system to return to the Step E6, which will thereby give influence to the judgment. This applies in the same way also to any other Step such as the Step E6.

Figure 12:
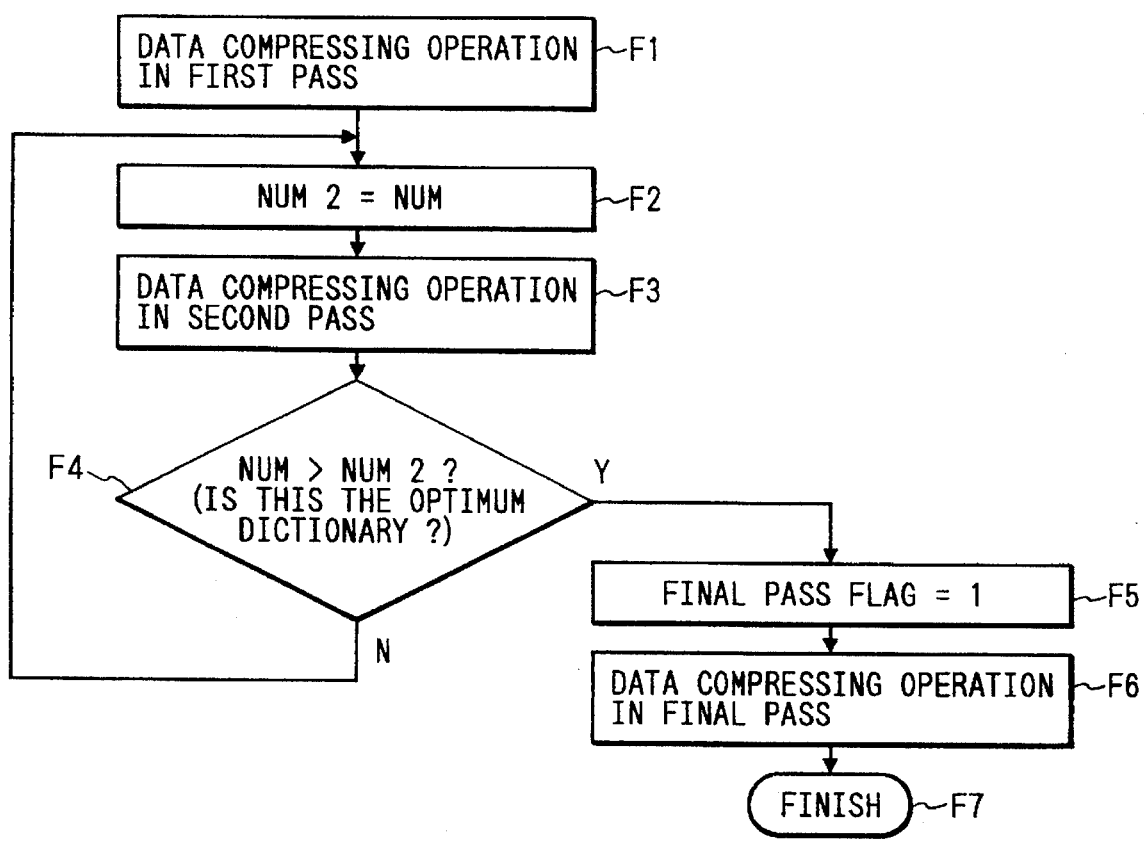
FIG. 12 is a flow chart for illustrating the processing operations to be performed in a plural number of passes for the optimization of the dictionary.

When the fist pass is completed with all the character strings taken as the objects of the data compression being stored in the working buffer after the system has repeated the course of processing operations described above, the system sets NUM2=NUM (the Step F2) as illustrated in FIG. 12. Here, the NUM is incremented by one at each time when the system passes through the Step E11, and this corresponds to an indicator of the number of times of output of the compressed data (In the actual practice as shown by the Steps E11 and E12, the system does not put out any compressed data to the outside until it has attained the final pass.)

Next, the system performs a second pass as shown at the Step F3. In this second pass, the system uses the dictionary which is updated in the first pass, and the dictionary will continue to be matured progressively. In the same manner as in the first pass, this second pass is performed on all the character strings that are taken as the objects of the data compression, the system performing the processing operations shown in FIG. 11. Next, at the Step F4, the system judges whether or not NUM>NUM2. In case it is found that NUM< or equal to NUM2, the identified state means that NUM, which represents the number of times of output of the compressed data at the Step F3 is smaller than NUM2, which represents the number of times of output of the compressed data at the Step F1, and this means that the compression ratio for the data has been improved. Therefore, the system will return to the Step F2 in this case, repeating the processing operations until the optimum dictionary is obtained. Then, when NUM>NUM2 occurs, the system judges that the optimum dictionary has been compiled and sets up the final pass flag=1 (the Step F5), and the system performs the data compressing operations in the final pass (the Step F6).

In the data compressing operations in the final pass, the system has set up the final pass flag=1, the judgment at the Step E10 shown in FIG. 11 will always be YES, so that the system moves always onto the Step E12. That is to say, at each time when the system passes through the Step E12 in this case, the system will put out the character string stored in the buf1 to the outside in the form of compressed data. Further, at the Step E12, the system does not register any new character string in the dictionary, unlike the case with the Step E11, and the dictionary will not be updated, but will remain as it was in the preceding pass, and the dictionary which is not updated as just mentioned will be put out to the outside as a static dictionary, together with the compressed data, and both of these are stored in a memory device or the like.

(D) Frequency of Usage

Now, in the process for compiling the optimum dictionary by the processing operations described above, there will be a case in which the number of the registered entries in the dictionary has reached a limit, making it impossible any new character string in the dictionary even if an attempt is made at registering a character string at a high frequency of usage. In such a case, a registered character string at a low frequency of usage is to be deleted, and a character string which the operator desires to register in the dictionary can be registered in the empty space made available by the deletion just mentioned.

Figures 13A, 13B:
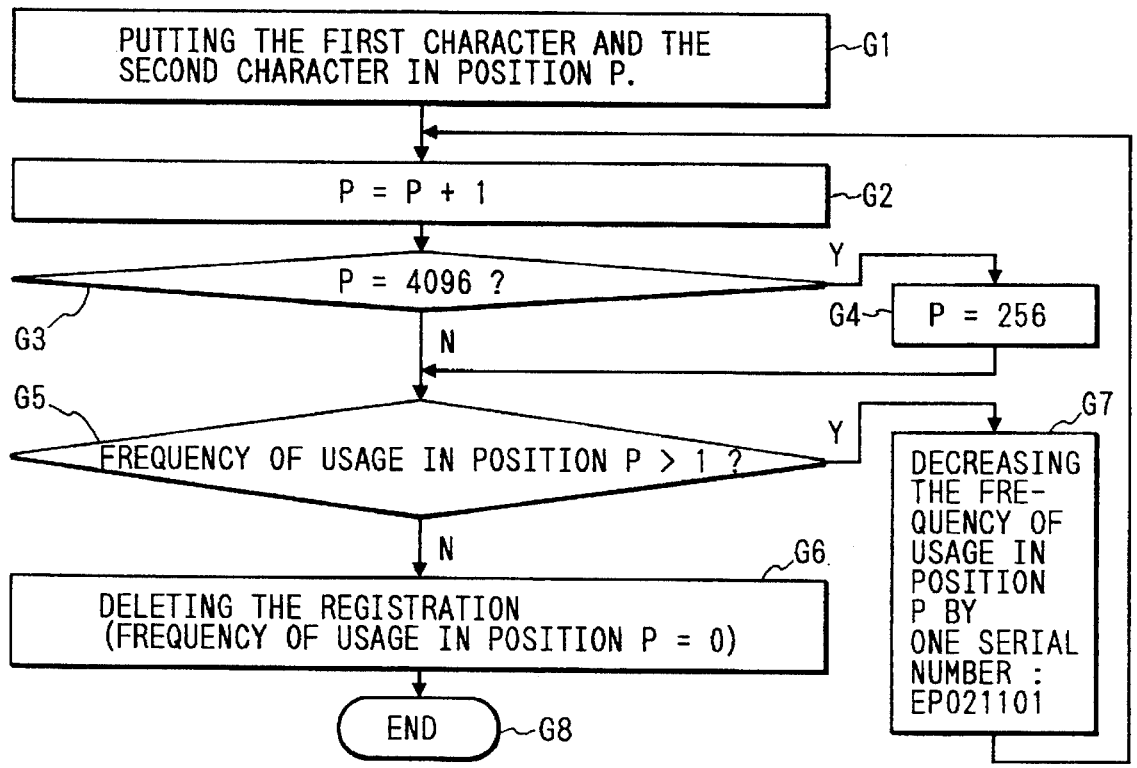
FIG. 13(A) is a chart for illustrating a dictionary which contains information on the frequency of usage.
FIG. 13(B) is a flow chart for illustrating the processing operations for deleting the registered character strings on the basis of their respective frequencies of usage.

FIG. 13(A) illustrates the construction of a dictionary containing information on the frequency of usage as mentioned above, and FIG. 13(B) presents a flow chart for the steps of processing operations for deleting a registered character string on the basis of the frequency of usage just mentioned.

Here, "P" represents the registration number to be assigned to a newly registered entry in the dictionary, and the initial value of P is 256. Then, as shown in FIG. 13(A), the registration numbers from 256 to 4095 are assigned to the segments in the area for entries for registration in the dictionary. The entry for each registration number has a segment in which the number for a first character is to be contained, a segment in which the number for a second character is to be contained, and a segment in which the frequency of usage is to be contained. The initial value of the frequency of usage is "0" in the entire segments, and thus the frequency of usage=0 expresses that no character string at all is registered in the particular segment.

In case a combination formed of a first character and a second character is to be newly registered, the system writes a first character and a second character in a character string in the byte P in the dictionary (at the 258th entry in the chart shown in FIG. 13(A)) as indicated by the Step G1 in FIG. 13(B). Next, the system sets P=P+1 (at the Step G2) and looks at the next segment (the byte No. 259). In this case, the value of P will be set at P=256 when it is found that P=4096 (the Step G3 and the Step G4). Next, the frequency of usage of the position P (the byte No. 259) is examined (the Step G5), and, if the frequency of usage>1, the system reduces the frequency of usage for the position P by one (the Step G7). Then, the system returns again to the Step G2 and, setting P=P+1, the system looks at the next position (the byte No. 260).

For example, let us now consider a case in which there is no empty space at all in the entries from 256 through 4095 in the dictionary. In this case, the processing operations at the Step G2 through the Step G5 will be repeated until the frequency of usage=0 is attained. Then, the character string registered in the position where the frequency of usage=0 has been attained first is deleted (at the Step G6). Then, in case any character string is to be newly registered in the dictionary, the system will register the character string in the empty space thus formed by the deletion of the registered character string.

By the processing operations described above, it is made possible for the system to delete the registered character string in the space containing a registered character string with the lowest frequency of usage out of the character strings respectively registered in the registration numbers from 256 through 4095, and the system is also enabled newly to register a character string in an empty space formed by the deletion of a registered character string. This feature enables the system to compile a dictionary containing those registered character strings with a high frequency of usage, which the system registers on a priority basis.

(E) Restoring Process

A dictionary which is compiled in the manner described in this example of preferred embodiment is constructed in a tree structure as illustrated in the following part.

(Dictionary)

256: 30+56

257: 80+16

258: 256+257

259: 256+257

260: 259+257

Accordingly, the registered character strings which are registered by the registration numbers, for example, from 256 to 260 in this dictionary are restored as shown below.

| (Restored Character Strings) | |
|---|---|
| 256 | = 30 + 56 |
| 257 | = 80 + 16 |
| 258 | = 256 + 40 |
| | = 30 + 56 + 40 | (256 = 30 + 56) |
| 259 | = 256 + 257 |
| | = 30 + 56 + 257 | (256 = 30 + 56) |
| | = 30 + 26 + 80 +16 | (257 = 80 + 16) |
| 260 | = 259 + 257 | (259 = 256 + 257) |
| | = 256 + 257 + 257 | (256 = 30 + 56) |
| | = 30 + 56 + 257 + 257 | (257 = 80 + 16) |
| | = 30 + 56 + 80 + 16 + 257 | |
| | = 30 + 56 + 80 + 16 + 80 + 16 | (257 = 80 + 16) |

As shown above, the restoration of a character string which is compressed by the method described in this example of preferred embodiment requires a decomposing process, which must be performed until all the character strings that constitute the registered character strings become smaller than 256. However, if a decomposing process as the one described above is performed when a character string is to be restored, there arises a problem in that the speed for the restoration of a character string will be very low. Thus, in order to overcome this problem, it is desirable to prepare a dictionary for its exclusive use for data restoration as described below from the regular dictionary compiled by the system and to store the dictionary for its exclusive use for data restoration in a memory medium such as a ROM and to use it at the time of a data restoration.

Figures 14A, 14B:
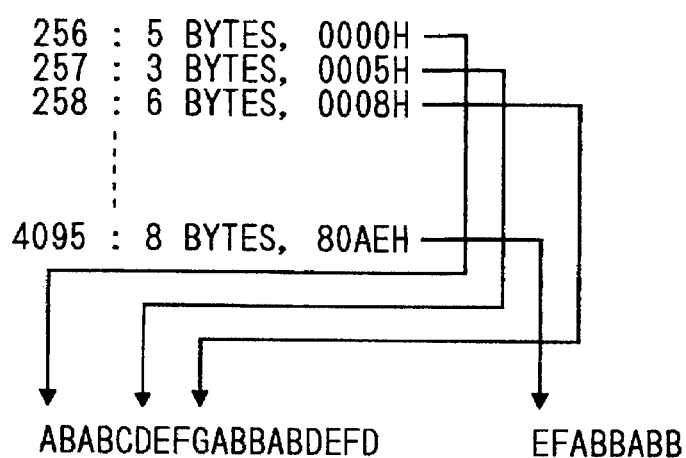
FIG. 14(A) is a chart for illustrating the construction of a dictionary for its exclusive use for the restoration of the compressed data.
FIG. 14(B) is a chart for illustrating the specification of the core portion of character strings on the basis of the character starting address and the character string length.

FIG. 14(A) illustrates the construction of a dictionary for its exclusive use for data restoration. Information on the length of a character string (i.e. the data length) and information on the character string starting address are stored as arranged in a serial order from the registration number 256 to the registration number 4095. Then, the core portion of the character strings (i.e., an arrangement of character strings) is stored behind the registration numbers. This core portion of the character strings are generated by the decomposing processes performed until all the character strings that constitute the registered character strings become smaller than 256, as described above, and these character strings will be the registered character strings for their exclusive use for data restoration.

When a data restoring operation is to be performed, the system specifies a corresponding starting address as stored in the core portion of the character strings by applying the character string starting address which is stored in the position of the registration numbers from 256 to 4095, as shown in FIG. 14(B). Then, the system performs a restoration of data by taking out a character string (i.e., a registered character string for its exclusive use for data restoration) in a length specified by the character string length as counted from this starting address. In this case, the core portion of the character string is subjected to a decomposing process in advance, as described above, and it is possible for the system to attain a much higher speed in the performance of a restoring operation with this dictionary for its exclusive use for data compression than in a data restoring operation performed with a dictionary formed in a tree structure.

Figure 15:
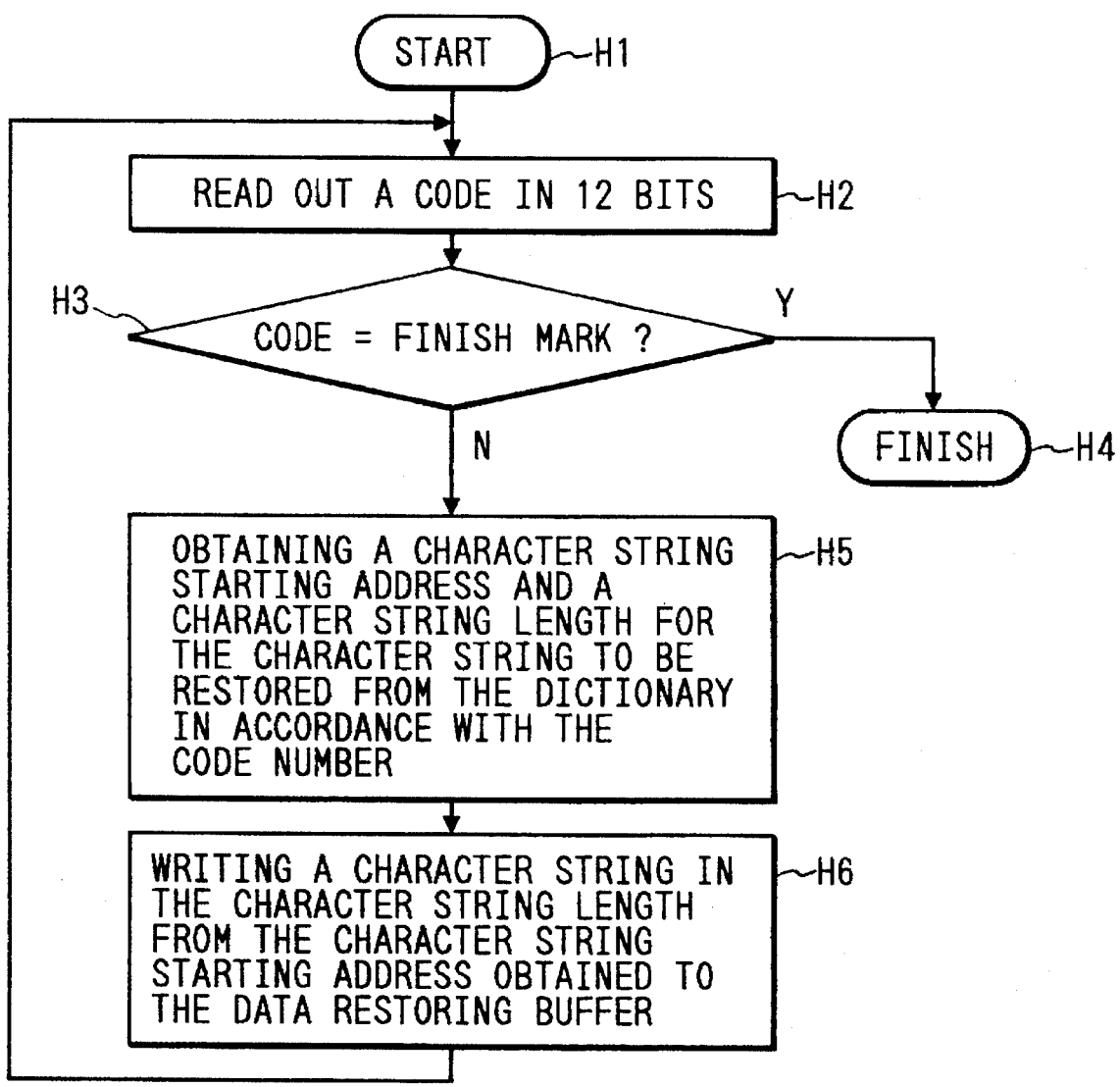
FIG. 15 is a flow chart for illustrating the data restoring operations in a case where a dictionary for its exclusive use for data restoration.

FIG. 15 presents a flow chart for the data restoring operations performed in a case in which this dictionary for its exclusive use for data restoration is used. First, the system reads out a 12 bit code at the Step H2, and, in case the code is an ending mark, the system finishes the operation (the Step H4), but, in case the code is not any ending mark, the system will move on to the Step H5. Then, the system obtains information on the character string starting address and information on the length of the character string as restored from the dictionary in accordance with the number of the code. Then, the system writes a character string in the character string length as measured from the character string starting address to the data restoring buffer (the Step 6). The system is capable of restoring the data by repeating the processing operations described above until it detects an ending mark.

3. Third Embodiment

The third example of preferred embodiment is an example of embodiment in which the present invention offers a process for compressing the so-called font data by an application of the data compressing method described in the first example of preferred embodiment or the data compressing method described in the second example of preferred embodiment given in the foregoing part.

(A) Bit Map Font Data

First, a description will be given with respect to a case in which bit map font data are compressed. The data of the bit map fonts are ordinarily arranged in the raster direction. However, in case bit map font data are to be compressed by the data compressing method described in this example of preferred embodiment, it offers a considerably higher compression ratio for the data to compress the data in the vertical direction. Therefore, it is designed to perform a compressing operation on the bit map font data in the vertical direction. However, it goes without saying that a compression of the data may be performed in the lateral direction.

As shown in FIG. 16(A), the bit map font data (40 dots×40 dots) are composed of an arrangement of five pieces of data blocks in the fixed length of 40 bytes. In this example of embodiment, the data compressing method described in the first example of embodiment or the data compressing method described in the second example of embodiment is applied to the compression of each of the blocks. Moreover, although a data compression is usually performed in this manner, it will be possible also to perform a data compression by the word string as the unit, with laterally arranged two bytes being set as one word as shown in FIG. 16(B), and not by the byte as the unit as shown in FIG. 16(A), in case priority should be given to the data restoring speed rather than to the data compression ratio. Such a data compression by the word as the unit is capable of increasing the data restoring speed, but, on the other hand, this method presents the problem that it requires that the number of the character strings which can be registered in the dictionary should be limited to a number in the proximity of 32768.

Figure 17:
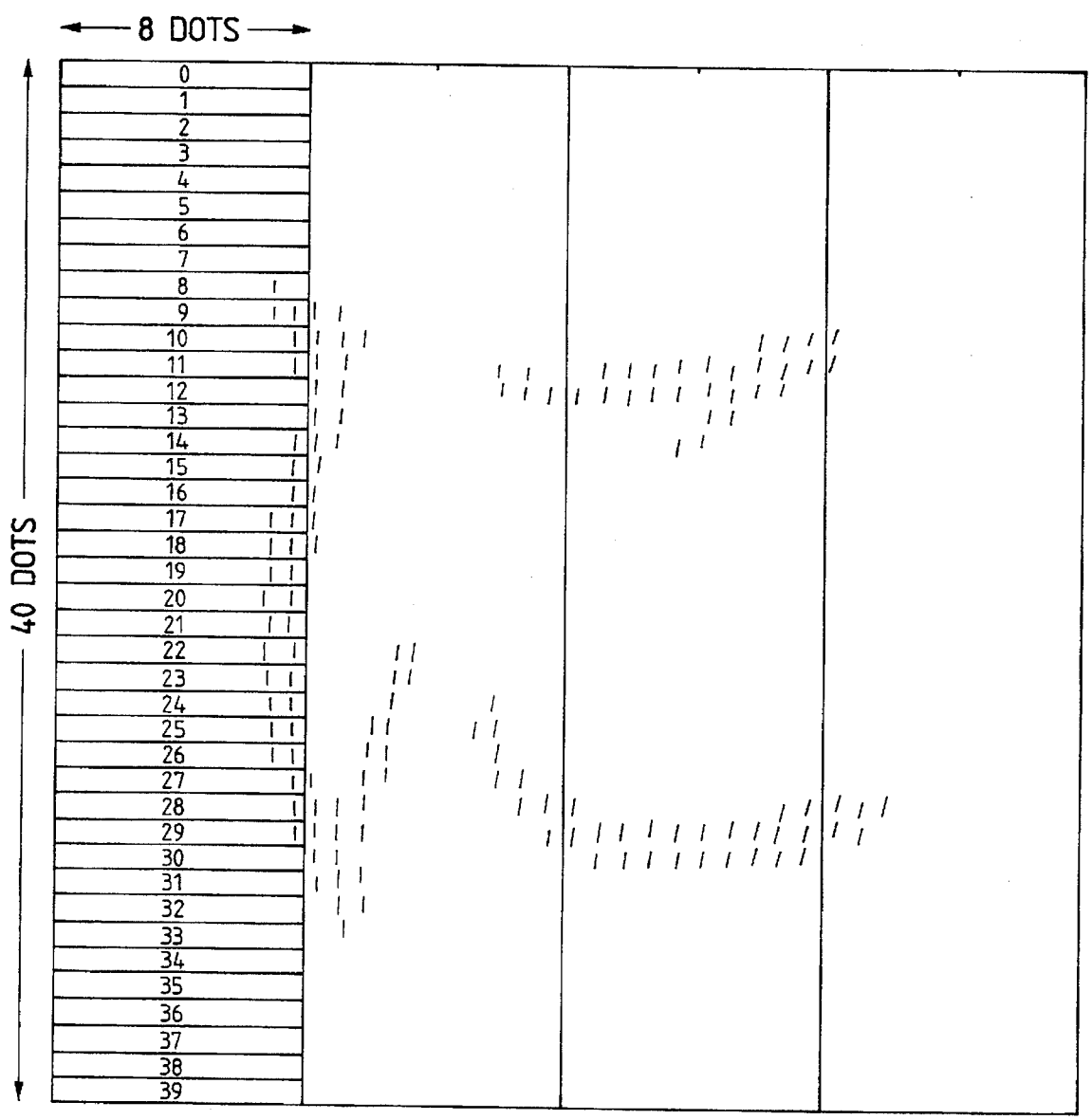
FIG. 17 is a schematic chart for illustrating the bit map image of a character.

FIG. 17 shows the Japanese Hirakana character "ni", for example, as rendered in bit map image. In FIG. 17, the area in which "1" is written is printed in black. Further, the other area contains "0" written in it, and this area is rendered in white. As it is clearly understood with reference to FIG. 17, the byte strings (data strings) 0 to 7, 12, 13, 30 to 39 in serial order will be 00h (hexadecimal representation) and the byte strings 10, 11, 14 to 16, and 27 to 29 will be 01h. Further, the eighth byte string will be 02h, and the byte strings 9, and 17 to 26 will be 03h. In this manner, byte strings in the same value appear in succession when a compression is performed on the bit map fonts in the vertical direction. Therefore, it can be understood that bit map font data can be compressed at a high rate of efficiency by the data compressing method described in the first example or the second example of preferred embodiment of the present invention.

(B) Outline Font Data

"Outline fonts" means a type of fonts which are designed to express the contour of a character with several dots and straight lines and curved lines connecting the dots. The characters in an ordinary size (for example 10 point) are printed with the bit map fonts described above, but some users may prefer printing some characters with fonts in a larger size, such as 32 point, in some cases. In such a case, it is difficult, in view of the relationship with the data capacity, to prepare the bit map font data in advance for the individual sizes. Therefore, outline fonts working as basic fonts for the individual characters should be provided in such a case, so that the outline fonts may be used to express the contours of characters, which can then be enlarged by a scaling process and can then be converted into data in bit map image as shown in FIG. 17, and outline fonts processed in this manner will make it possible to print the characters in a desired size 1.

Figure 18:
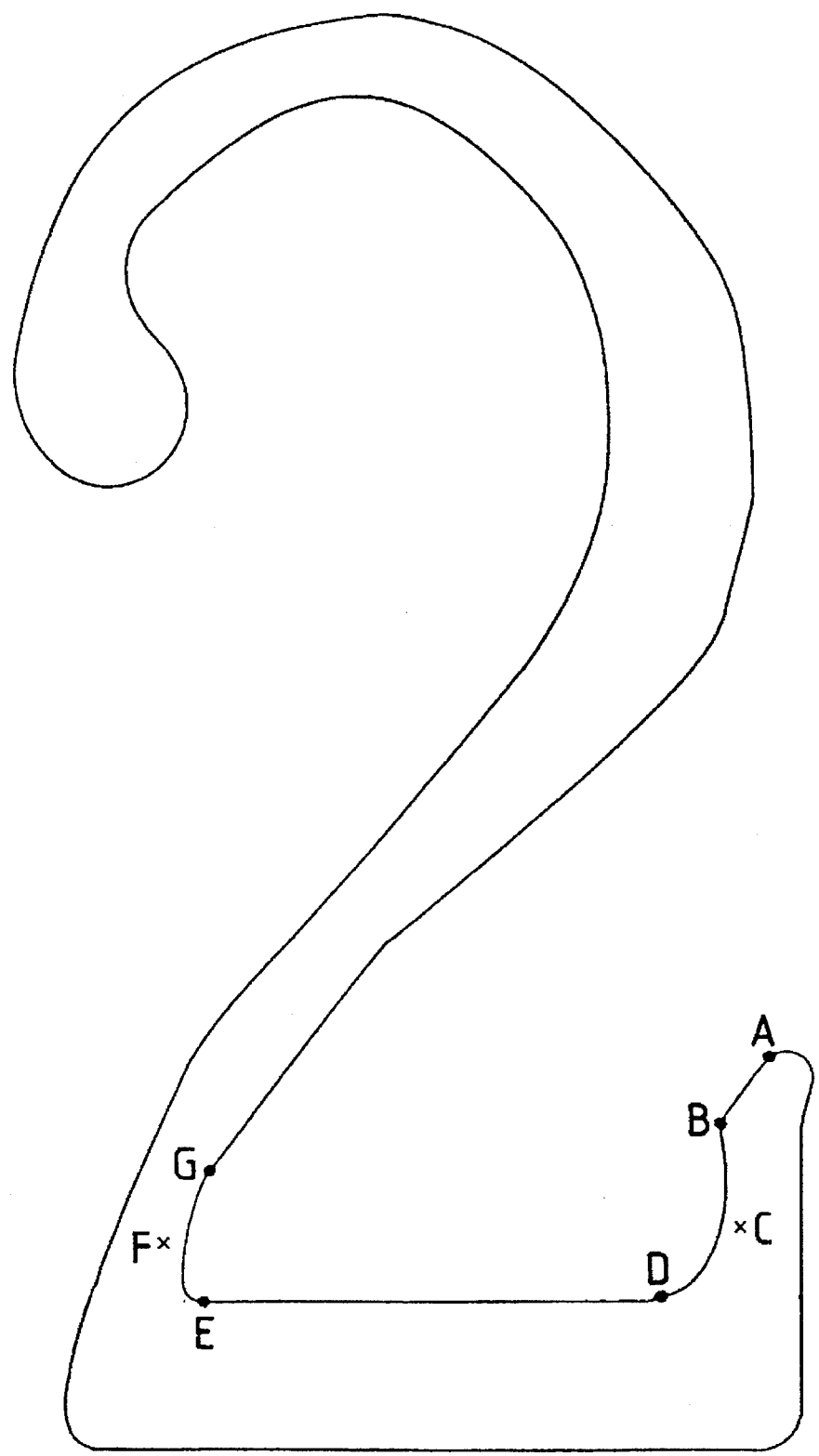
FIG. 18 is a schematic chart for illustrating an outline font.

For example, the contour of the character "2" can be expressed by the dots A, B, C, D, E, F, G . . . and straight lines and curved lines connecting these dots, as shown in FIG. 18. Then, in this example of preferred embodiment, the data of outline fonts are described in the data format called the NSI Format.

Figure 19A:
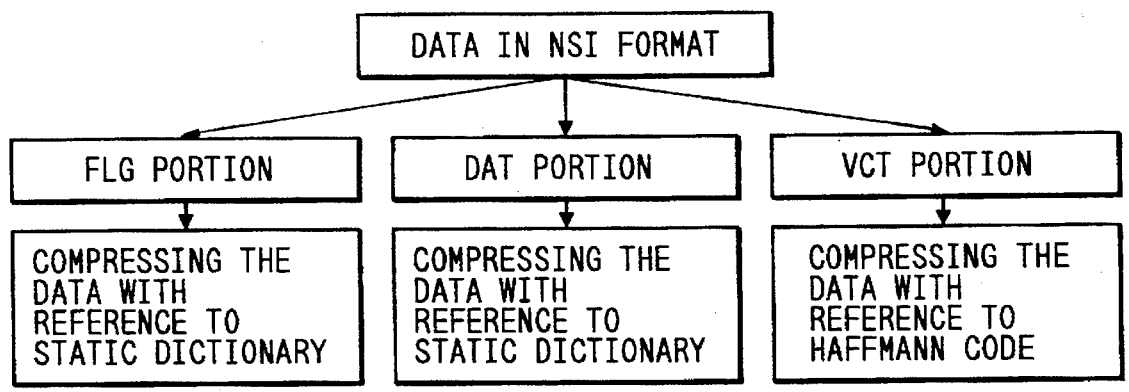
FIGS. 19(A) and 19(B) are schematic charts respectively illustrating the compression of outline font data.

Now, in this example of preferred embodiment, the data on the outline fonts which have been described in this NSI Format are compressed as separated in three parts, i.e., the FLG part, the DAT part, and the VCT part, as shown in FIG. 19(A).

Here, the data in the VCT part are information expressing the vector coordinates in the print-out direction at the individual points, and the data contain the information on the coordinates X and Y at each point. Further, these coordinates X and Y do not express the absolute values of the coordinates but express a relative value from one preceding point.

Figure 19B:
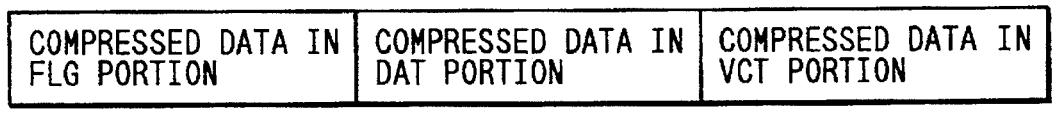

Further, the data in the FLG part furnish information on the attributes of the individual points, and this FLG part contain information on such points as "The point A forms a starting point," "The point A and the point B are connected by a straight line," "The point B and the point D are connected by a curved line (Bezet curve) with its intermediate point at the point C," "The point D and the point E are connected by a straight line," "The point E and the point G are connected by a curved line (Bezet curve) with its intermediate point at the point F," and so on. Further, the data in the DAT part express the characteristic features of the characters and include information expressing the sizes of the characters, and information expressing the line widths of the characters. In this example of preferred embodiment, the data of the VCT part are condensed by the Haffmann Coding Method. In contrast with this, the data in the FLG part and the data in the DAT part have some regularity such as the continuation of the same data, and so the data in these parts are compressed by the data compressing method described in either the first example or the second example of embodiment of the present invention. This data compressing method makes it possible to achieve a sharp increase of the data compression ratio by decomposing the component elements which form such outline font data for their separation into the individual component elements and then compressing the outline font data as thus separated into components in the manner described above. Then, as shown in FIG. 19(B), the structure of the data after their compression will be composed of an arrangement of only the compressed data of the FLG part, then an arrangement of only the compressed data of the DAT part, and then an arrangement of only the compressed data of the VCT part. Furthermore, a dictionary for its exclusive use for the proper restoration of the compressed data will be provided for each of the FLG part, the DAT part, and the VCT part.

Figure 19C:
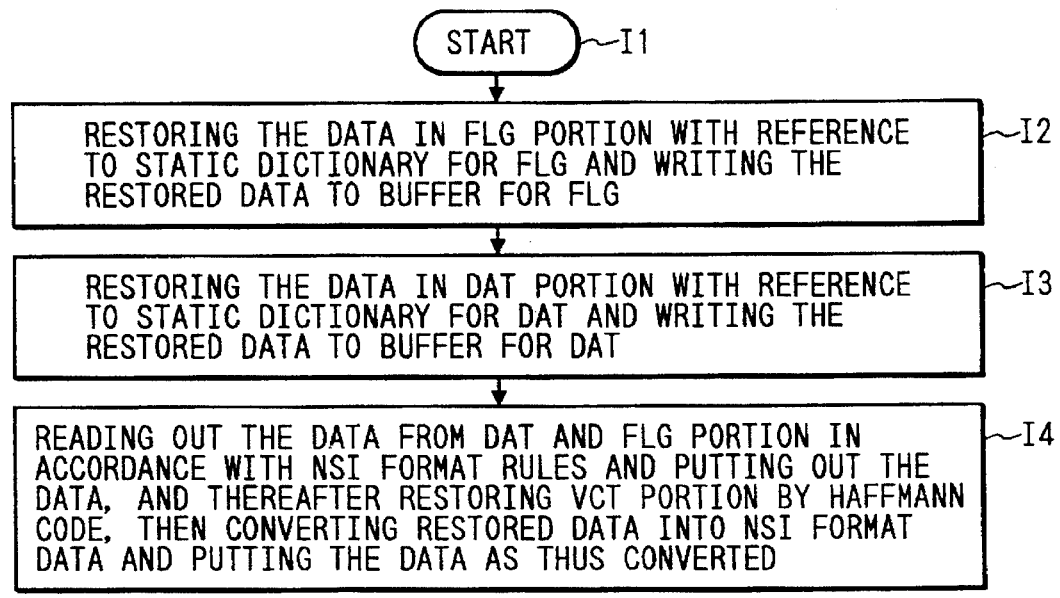
FIG. 19(C) is a flow chart for illustrating the processing operations for restoring the compressed data.

When the compressed data are to be restored, the data in the FLG part and the data in the DAT part are restored, and the data in the VCT part are thereafter restored on the basis of the restored data in the FLG part and those in the DAT part. FIG. 19(C) shows a flow chart for these data restoring operations. First, at the Step 12, the system restores the compressed data in the FLG part with reference to a static dictionary for its exclusive use for the data in the FLG part and writes the restored data to a buffer, which is provided for the data in the FLG part, so as temporarily to store the data therein. Next, at the Step 13, the system restores the compressed data in the DAT part with reference to a dictionary for its exclusive use for the data in the DAT part and writes the restored data to a buffer, which is provided for the data in the DAT part, so as temporarily to store the data therein. In this state, the pointer for reading out the data points to the foremost part of the compressed data in the VCT part, as shown in FIG. 19(B).

Next, as shown in respect of the Step 14, the system reads and puts out the restored data in the DAT part and the restored data in the FLG part from the above-mentioned buffers in accordance with the rules for the NSI format, and the system thereafter restores the compressed data in the VCT part to the data in the Huffman code in accordance with the bit 0 to bit 3 in the data read out of the FLG part (the details of these bits will be described later). By taking this procedure of the processing operations, the system can obtain the original outline font data as restored in the serial order of the NSI format.

Now, the system in this example of preferred embodiment performs the data compressing process after it has changed the data in the FLG part and those in the VCT part each mentioned above into data which can be expressed by a coordinate point control section and a coordinate point defining section, each of which is described below, in order to attain a further improvement on the compression ratio of the data.

Here, the bit 4 to bit 7 in the coordinate point control section are the same as the bit 4 to the bit 7 in the original data in the FLG part, and these bit 4 and bit 7 are applied to the specification of the attributes at each point, i.e., these bits specify which of the starting point, the intermediate point, and the ending point is indicated and which of moving interpolation, linear interpolation, and curve interpolation is indicated. Also, the bit 0 to the bit 3 in the coordinate point control section respectively express that the values of the vector coordinates as defined by the coordinate point defining section will be in the meaning described below. That is to say, the bit 0 expresses the meaning that the vector coordinate X is in a value other than 0 and is present, and the bit 1 expresses the meaning that the vector coordinate Y is in a value other than 0 and is present. Further, the bit 2 expresses the meaning that the vector coordinate X is in a negative value. Moreover, the bit 3 expresses the meaning that the vector coordinate Y is in a negative value.

The coordinate point defining section has an arrangement of ten-bit codes (0 to 1023) and, by applying these codes and by specifying any of the bit 0 to the bit 3 in the coordinate point control section, the system is capable of expressing the values of the vector coordinates in the range of:

$-1024 \leq$ vector coordinate $X \leq 1024$ $-1024 \leq$ vector coordinate $Y \leq 1024$ For example, when the bit 0=1, it is indicated that the data X-1 are present in the coordinate point defining section. Also, when the bit 1=1, it is indicated that the data Y-1 is present in the coordinate point defining section. When there is any vertical bar, a horizontal bar, or the like in the characters, the vector coordinate=0 or the vector coordinate=0 occurs in some cases. In such a case, it will not be necessary to put out the vector coordinate X and the vector coordinate Y as compressed data. It follows from this that it will be possible to attain a further improvement on the data compression ratio in such a case, provided that it is possible to specify the presence or absence of the vector coordinate X or the vector coordinate Y in the coordinate point defining section by a control operation performed on the bit 0 and the bit 1 in the coordinate point control section. Further, the specification of the positiveness or negativeness in the vector coordinate X or the vector coordinate Y can be effected by such a specification in the bit 2 or in the bit 3 of the coordinate point control section as mentioned above, and it is possible thereby to achieve a further improvement on the data compression ratio.

As described above, the present invention disclosed in this example of preferred embodiment is capable of performing an effective and efficient compression of bit map font data and outline font data. Further, in the course of such a data compression, the system uses a static dictionary described in the first example of preferred embodiment and in the second example of preferred embodiment. In this case, it will be desirable to set up a common static dictionary for reference thereto in common with all the characters in the same typeface style (i.e., fonts). For example, a dictionary for its exclusive use for the Ming-style characters is to be used for all the characters in the Ming style for performing the updating of the dictionary and the compression of data, and an ultimate static dictionary and compressed data are thereby obtained. Also, for characters in the Gothic style, data compressions, as well as the updating of the dictionary, are to be performed entirely with reference to a dictionary for its exclusive use for characters in the Gothic style, the system thereby producing an ultimate static dictionary and compressed data. Thus, it becomes possible to perform an efficient compression of data by using one dictionary common to all the characters in each typeface style as described above. This performance is attributed to the greater ease realized in the compression of data through the common use of a dictionary for all the characters in one character style because the characters in a common typeface style have common features, for example, in the manner of changes in the contour of characters (such as the manner in which a line leaps up in characters) and in the thickness of a contour line among the various characters in one typeface style, so that the same information on the characteristic features of the characters themselves, the information on the attributes of the individual contour points, and so on can be shared in common among the characters in the same character style. In this case, the static dictionaries and the compressed data put out to the outside will be classified according to the character styles and stored as thus classified in a memory device.

Figure 20:
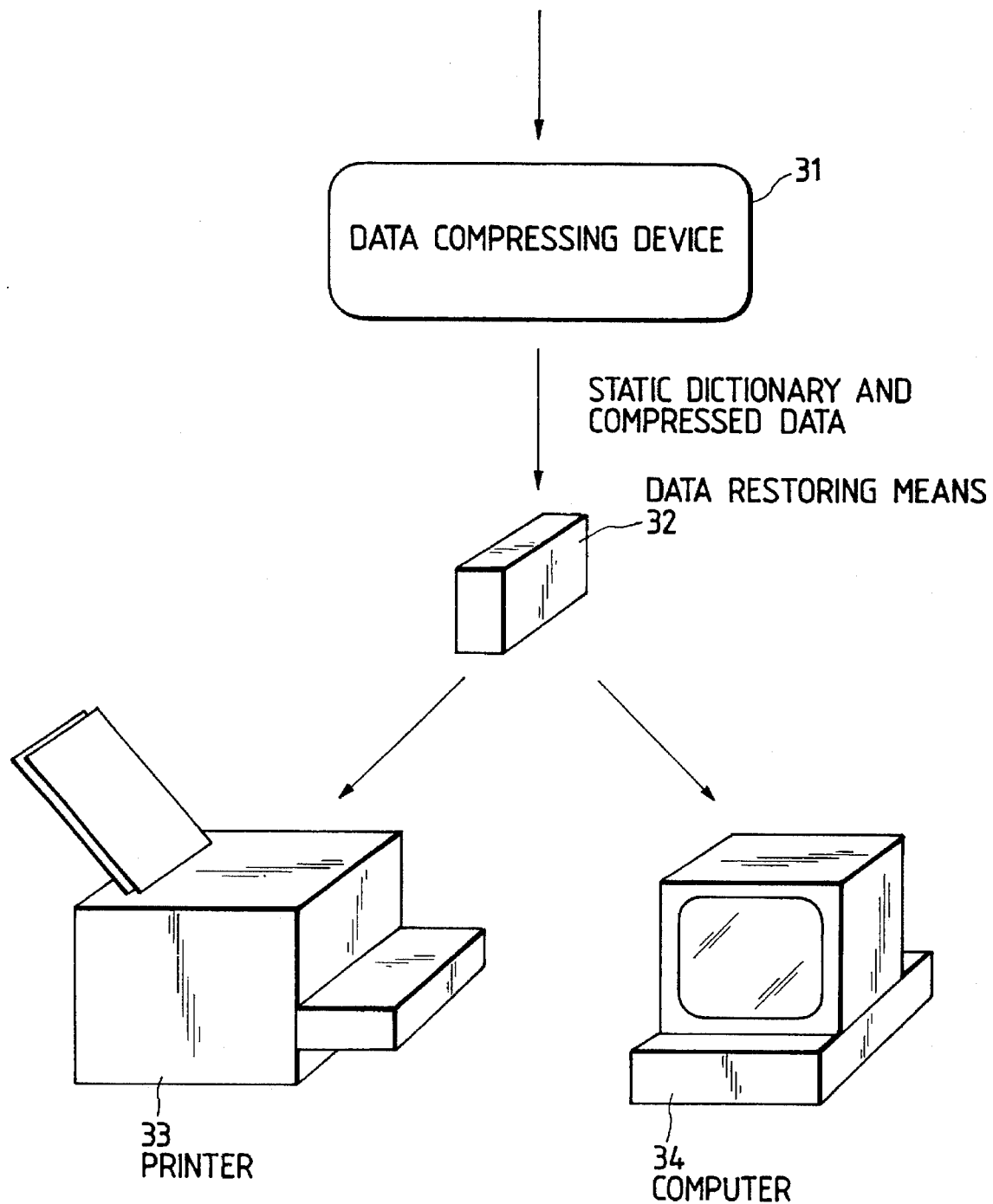
FIG. 20 is a chart which illustrates the modes of the utilization of the data compressing method described in the embodiment.

FIG. 20 illustrates the manners of utilization of the data compressing method as described above in this example of preferred embodiment. The data strings (i.e., font data) taken as the object of the data compression are put into a data compressing device 31 and compressed by the data compressing method described in this example of preferred embodiment, and the static dictionary and the compressed data both of which are produced by this data compressing process are stored in the memory device (such as a ROM) in a data restoring means 32. Then, this data restoring means 32 will be built, for example, into a printer 33 or a computer 34 or the like (the data restoring means 32 may be divided and separately built into two devices).

In a conventional printer or the like, the font data and the like are stored, without any compression thereof, in a memory device, and a printing operation is performed with the font data being put out as required from time to time by the control performed on the addresses for the storage of the individual compressed data. In contrast with this, the method described in this example of preferred embodiment stores a static dictionary and the compressed data in a memory device and is capable of putting out the characters as necessary from time to time by the control performed on the addresses for the storage of the individual compressed data and on the static dictionary containing the character strings registered therein. By this, it is made possible to reduce the amount of data to be stored in a memory device and thereby to make an attempt at reducing the cost of the apparatus. An advantage like this is effective particularly for such characters as the Chinese characters and the Hangul characters, which are in need of a large memory capacity, and this advantage, of course, produces a remarkable effect also for the characters in any other language.

In this regard, it should be noted that the present invention is not limited in any way to the examples of its preferred embodiments presented above, but is applicable in various forms of its embodiment with modifications made within the scope of the purports of the present invention.

For example, the methods described in this example of preferred embodiment have been described mainly with respect to the processing of data in character strings, but can be applied to the processing of data on any other marks and signs.

Further, the data strings which are compressed by the data compressing method according to the present invention include various forms of data strings, which are not limited to character strings, byte strings, and word strings, and may include those data strings which, for example, compose a two dimensional chart or a three dimensional chart.

Further, the registration numbers according to the present invention include any information that performs substantially the same function as this registration number.

The present invention according to aspect 1 thereof offers a data compressing method which uses the optimum dictionary in the form of a static dictionary, and the system performs a data compressing process with reference to such a static dictionary, so that the method can optimize the amount of data in the static dictionary and the amount of the compressed data put out of the system. Owing to these advantageous features, the method according to the present invention can reduce the capacity of the memory device or the memory medium in which this static dictionary and the compressed data are to be stored and can thereby make an attempt at reducing the cost or the like. Further, it is also possible for the system which operates by this method to achieve a very high ratio of data compression since it is possible for the system described herein to apply a data compressing algorithm or the like which uses a dynamic dictionary which can attain a very high data compression ratio. Further, the method also makes it possible for the system freely to restore the necessary data strings with reference to such a static dictionary, and this method also makes it possible for the system freely to take out any desired character string, for example, in a case in which this compressed data string is to be restored by an information processing apparatus or the like. Further, this method can also produce the advantageous effect that the speed for performing the data restoring process, through optimization of the dictionary, will not be decreased in itself even though there is some possibility that the time needed for obtaining the ultimate dictionary and the compressed data may be extended.

Further, the present invention according to aspect 2 thereof offers a data compressing method whereby the system can replace the combinations of data strings with the registration numbers in the dictionary, giving priority to those combinations of word strings which consist of a larger number of word strings. Therefore, the system is capable of optimizing the compression ratio for the data. In addition, this system deletes those registered data strings which record a lower frequency of usage and finishes the updating of the dictionary at the stage where the number of the registered entries in the dictionary has attained a predetermined number, and, therefore, it is possible for the system to compile an optimum dictionary which is composed of a small amount of data. The method disclosed in this invention offers also another advantage in that it is capable of compiling a dictionary in a simple way by a method called the "sliding dictionary method". In this regard, the predetermined number of the registered entries in the dictionary can be set at such a number which can be contained within the range of twelve bits in case the number of bits for the output data is, for example, twelve bits.

Further, the present invention according to aspect 3 thereof offers a data compressing method which replaces the combinations of data strings, giving priority to those combinations which record a high probability of occurrence, and it is therefore possible for the system according to this invention to optimize the data compression ratio. In addition, the method according to this aspect of the present invention deletes those registered entries of data strings which record a lower frequency of usage and finishes the updating of the dictionary at the stage where the number of the registered entries in the dictionary has attained a predetermined number, and it is therefore possible for the system operating by this method to compile an optimum dictionary composed of a small amount of data. The method also offers another advantage in that it is capable of compiling an initial dictionary by an analysis at one time and is accordingly capable of achieving a very remarkable simplification of the processing operations.

Further, the present invention according to aspect 4 thereof offers a data compressing method whereby the system can performs a data compressing process, operating by a data compressing algorithm with reference to a dynamic dictionary at a high ratio of data compression, and, since the system finishes the updating of the dictionary at a stage where the data compression ratio attains its optimum, this method is capable of attaining a very sharp increase of the data compression ratio. In the meantime, the dictionary which is put out by this system is compiled in the form of a static dictionary, and it is thus possible for the system freely to restore any data string as necessary with reference to this static dictionary.

Further, the present invention according to aspect 5 thereof offers a data compressing method whereby the system is capable of keeping the number of the entries registered in the dictionary much smaller as compared with the number of the entries registered in a dictionary according to the conventional incremental decomposition method, particularly in a case in which the same data strings are to be processed, and the system operating by this method is also capable of keeping the compressed data themselves, which have been replaced with some registration numbers in the dictionary and subjected to a data compression, in a much smaller data amount in comparison with the amount of such data produced by the conventional incremental cracking method.

Further, the present invention according to aspect 6 thereof offers a data compressing method which is capable of attaining a very sharp increase of the data compression ratio and also freely restoring any data string as necessary with reference to this static dictionary. This method according to this invention also offers the advantage that it is possible for the system to judge, whether or not the optimum data compression ratio has been attained, only with reference to the number of times of the repetitions of the process.

Further, the present invention according to aspect 7 thereof offers a data compressing method which is capable of adjusting the amount of data registered in the dictionary to the optimum size of such data in a very simple manner.

Further, the present invention according to aspect 8 thereof offers a data compressing method which is capable of adjusting the amount of the data in the dictionary to the optimum size in a very simple manner in case there is a limit to the number of entries which can be registered in the dictionary.

Further, the present invention according to aspect 9 thereof offers a data compressing method which enables the system to compress bit map font data and outline font data, and the method can therefore reduce the capacity of a memory device or memory medium in which these font data are to be stored, and this method can thereby achieve a reduction of the cost for a printer, a computer, or the like which has such a memory device or a memory medium built in it.

Further, the present invention according to aspect 10 thereof offers a data compressing method which can change the applied data compressing method in accordance with the characteristics of the data and can thereby attain a further increase of the compression ratio of the data.

Further, the present invention according to aspect 11 thereof offers a data compressing method which compiles and uses one common dictionary for each of such various character styles as the Ming style and the Gothic style. For examples, it occurs in many cases that the manner of changes in the contours of the characters and the thickness of the contours are common to the characters in the same character style, and it is therefore possible for the method according to the present invention to compress the data in a more efficient manner.

Further, the present invention according to aspect 12 thereof offers a data compressing method whereby the system can reduce the capacity or the like necessary for storing the character data in memory.

Further, the present invention according to aspect 13 thereof offers a data compressing method operating with reference to registered character strings which, being intended for their exclusive use for data restoration, have already been converted into a data format for exclusive use for data restoration, and the registered data strings are decomposed to such an extent that the tree structure is eliminated, for example, in the process performed by the incremental decomposition method or by the augmentative decomposition method. Therefore, the system operating by this method is capable of performing the data restoring process much faster than in the case in which the data restoring process is performed with reference to an ordinary dictionary.

Further, the present invention according to aspect 14 thereof offers a data restoring method by which the system is capable of performing a predetermined process, for example, printing the characters, using the restored data strings.

Further, the present invention according to aspect 15 thereof offers an information processing apparatus which enables the system to restore the original data strings by a data restoring means and also allows such a data restoring means to be built into an information processing apparatus, such as a computer or a printer.

What is claimed is:

1. A data compressing method for performing a data compression by using a dictionary capable of registering a registered data string as correlated with a registration number and by replacing a combination of two or more data strings with the registration number just defined;

wherein the data compressing method is characterized by:
comprising the processes defined hereinbelow and repeating the process (B) and the process (C) defined below until all the data strings which are to be taken up as the objects of the data compression are stored in the work area to be defined below:
(A) a process for taking a predetermined number of data strings out of the data strings which are taken as the objects of the data compression and then storing the data strings thus taken out in the predetermined number in a work area having a predetermined number of buffers;

(B) a process for performing an analysis for determining whether or not the combination of the data strings stored in any adjacent buffers in the work area defined above is registered in the dictionary, replacing the particular combination of data strings with the above-defined registration number in the dictionary and also making a shift of the data strings within the work area so as to fill up the empty buffer appearing as the result of the replacement, in the event that the particular combination of data strings is registered in the dictionary, then taking the subsequent data strings into the empty buffer which has appeared at the end portion of the work area as the result of such a shift of the data strings in the manner defined above, and then performing an analysis again for determining whether or not the specific combination of data strings stored in any adjacent buffers in the work area is registered in the dictionary; and (C) a process for registering in the dictionary the combinations of data strings stored in a first buffer and a second buffer as counted from the top portion of the work area and also deleting the data strings stored in the first buffer and then making a shift of the data strings in the work area in such a manner as to fill up the empty buffer appearing as the result of the deletion, and taking the subsequent data strings into the empty buffer which has appeared at the end portion of the work area as the result of the shift of the data strings in the manner as defined above, in the event that it has been determined by the analyses defined in respect of the process (B) defined above that none of the combinations of the data strings stored in any adjacent buffers in the work area are registered in the dictionary.

2. A data compressing method as defined in claim 1 which performs data compressing operations in the current pass, using the dictionary as updated in the immediately preceding pass, in which the repetition of the process (B) and the process (C) as defined above until the processes have been completed on all the data strings taken as the objects of the data compression are regarded as constituting one pass, wherein the data compressing method is characterized by making a transition to the next pass, in case the number of repetitions of the above-defined processes (B) and (C) in the current pass is not any more than the number of repetitions of the same processes (B) and (C), but putting out the dictionary as updated in the immediately preceding pass as the ultimate static dictionary for use in restoring the compressed data strings and also performing data compressing operations in one pass with reference to the ultimate static dictionary just defined, and putting out the resulting compressed data strings as the ultimate compressed data for use in the restoration of the compressed data, in case the number of repetitions of the above-defined processes (B) and (C) in the current pass is in any excess of the number of repetitions of the same processes (B) and (C) in the immediately preceding pass.

3. A data compressing method as defined in claim 1, which is characterized by comprising:

a process for storing usage frequency information, together with the registration number and the registered data string, in the dictionary defined above, and a process for deleting the registered data strings having a low frequency of usage thereof in the ascending serial order.

4. A data compressing method as defined in claim 3, which is characterized by performing the deletion of the registered data strings having a low frequency of usage thereof, by making successive decreases in the frequency in usage of the registered data strings as registered in the dictionary and deleting the registered data strings in serial order based on priority attached to the successive order of earliness in time in which those registered data strings respectively fall below the predetermined frequency of usage thereof.

5. A data compressing method as defined in claim 1, which is characterized in that the data strings taken as the objects of the data compression are font data required on the occasion when characters are to be printed.

6. A data compressing method as defined in claim 5, which is characterized in that only some parts of the font data defined above are processed as the data strings taken up for the data compression defined above and some parts of the other parts of the font data are processed for their data compression by another data compressing method.

7. A data compressing method as defined in claim 5, which is characterized by performing data compression, using the above-defined dictionary in common to the above-defined characters having a common font style.

8. A data compressing method as defined in claim 1, which is characterized in that the data strings taken up as the objects of data compression are character strings.

9. A data compressing method as defined in claim 1, which is characterized in that a dictionary for the exclusive use thereof for data restoration is compiled from the information on the registration numbers and the registered data strings contained in the ultimately compiled dictionary, the dictionary so compiled for its exclusive use for data restoration containing therein the registered data strings for exclusive use thereof for restoration, which are prepared by converting the registered data strings defined above into data strings in a data format for exclusive use thereof for data restoration, and also containing information on the data length of the above-defined registered data strings for exclusive use thereof for data restoration and the starting address for the above-defined registered data strings for exclusive use thereof for data restoration.

10. A data restoring method which is characterized by restoring the data strings processed as the objects of data compression by a compressed data restoring method appropriate for the particular data compressing method by using the compressed data generated by a data compressing method as defined in claim 1 with reference to the ultimate dictionary compiled by the particular data compressing method.

11. An information processing apparatus which is characterized by comprising means for performing a data compressing method for generating compressed data and for compiling an ultimate dictionary by a data compressing method defined in claim 1 and means for restoring the compressed data strings processed as the objects of the data compression by performing data restoring operations appropriate for the particular data compressing method on the compressed data and with the ultimate dictionary compiled by the particular data compressing method.

* * * * *